(12) United States Patent
Staats

(10) Patent No.: US 6,714,000 B2
(45) Date of Patent: *Mar. 30, 2004

(54) METHOD FOR MONITORING POWER AND CURRENT FLOW

(75) Inventor: Preston Trent Staats, Austin, TX (US)

(73) Assignee: Genscape, Inc., Louisville, KY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 68 days.

(21) Appl. No.: 09/332,850

(22) Filed: Jun. 14, 1999

(65) Prior Publication Data

US 2002/0101231 A1 Aug. 1, 2002

(51) Int. Cl.[7] .................. G01R 29/16; G01R 21/00; G08C 19/16
(52) U.S. Cl. .................. 324/126; 324/107; 340/870.25; 702/62
(58) Field of Search .................. 324/126, 127, 324/529, 207.2, 239, 103 R, 106, 107, 142, 263; 340/870.01, 870.02, 870.25; 307/112, 129, 125; 379/106.03; 702/61, 62

(56) References Cited

U.S. PATENT DOCUMENTS

| | | |
|---|---|---|
| 3,312,898 A | 4/1967 | Browne, Jr. |
| 3,652,935 A | 3/1972 | Shaw |
| 3,959,724 A | 5/1976 | Chana et al. |
| 4,002,975 A * | 1/1977 | Erickson et al. ............ 324/501 |
| 4,158,810 A | 6/1979 | Leskovar ..................... 324/127 |
| 4,277,744 A | 7/1981 | Audone et al. |
| 4,361,805 A | 11/1982 | Narimatsu et al. |
| 4,384,289 A | 5/1983 | Stillwell et al. ....... 340/870.17 |
| 4,395,677 A | 7/1983 | Petersdorf |
| 4,414,510 A | 11/1983 | Milkovic |
| 4,539,520 A | 9/1985 | McBride |
| 4,635,055 A | 1/1987 | Fernandes et al. |
| 4,700,188 A | 10/1987 | James |
| 4,709,339 A | 11/1987 | Fernandes |
| 4,717,872 A | 1/1988 | Wagner et al. |
| 4,727,323 A | 2/1988 | Zabler |
| 4,728,887 A | 3/1988 | Davis |

(List continued on next page.)

OTHER PUBLICATIONS

International Search Report, Aug. 23, 2000, International Application No. PCT/US00/16528.

"IEEE Standard Procedures for Measurement of Power Frequency Electric and Magnetic Fields from AC Power Lines," *IEEE Std.* 644–1994, Institute of Electrical and Electronics Engineers, New York, NY, 1994.

Fulcomer, "NBS Ambient Magnetic Field Meter For Measurement and Analysis of Low–Level Power Frequency Magnetic Fields in Air," published by *U.S. Dept. of Commerce*, NBSIR 86–3330 Dec. 1985.

Primary Examiner—N. Le
Assistant Examiner—James Kerveros
(74) Attorney, Agent, or Firm—Stites & Harbison, PLLC; David W. Nagle, Jr.

(57) ABSTRACT

A method for remotely monitoring the magnitude and direction of net electrical power and current flow to or from a facility over a prolonged period of time. The method includes detecting and measuring the magnetic field emanating from the monitored line(s), and detecting a signal synchronized to the power system frequency, typically the electric field, emanating from the power lines. The method further includes evaluating, storing, and transmitting the data on the electromagnetic (EM) fields that are recorded.

15 Claims, 5 Drawing Sheets

U.S. PATENT DOCUMENTS

| | | | |
|---|---|---|---|
| 4,799,005 A | 1/1989 | Fernandes | 324/127 |
| 4,801,937 A | 1/1989 | Fernandes | |
| 4,806,855 A | 2/1989 | Davis | |
| 4,808,917 A | 2/1989 | Fernandes et al. | |
| 4,829,298 A | 5/1989 | Fernandes | 340/870.27 |
| 4,847,780 A | 7/1989 | Gilker et al. | |
| 4,857,837 A | 8/1989 | Baran et al. | |
| 4,886,980 A * | 12/1989 | Fernades et al. | 307/129 |
| 4,891,576 A * | 1/1990 | Jacobs et al. | 324/457 |
| 5,006,846 A * | 4/1991 | Granville et al. | 324/126 |
| 5,049,809 A | 9/1991 | Wakatsuki et al. | |
| 5,140,257 A | 8/1992 | Davis | |
| 5,181,026 A | 1/1993 | Granville | |
| 5,194,850 A | 3/1993 | Bourrieres et al. | |
| 5,206,596 A * | 4/1993 | Beihoff et al. | 324/127 |
| 5,250,894 A | 10/1993 | Bridges et al. | |
| 5,438,256 A | 8/1995 | Thuries et al. | 324/117 |
| 5,473,244 A | 12/1995 | Libove et al. | |
| 5,517,106 A | 5/1996 | Longini | |
| 5,545,981 A | 8/1996 | Dubin et al. | |
| 5,568,402 A | 10/1996 | Gray et al. | |
| 5,570,034 A | 10/1996 | Needham et al. | |
| 5,673,196 A | 9/1997 | Hoffman et al. | |
| 5,717,388 A | 2/1998 | Janoska et al. | 340/870.16 |
| 5,729,144 A | 3/1998 | Cummins | |
| 5,757,283 A | 5/1998 | Janoska | 340/870.16 |
| 5,764,065 A | 6/1998 | Richards et al. | |
| 5,767,668 A | 6/1998 | Durand | 324/117 |
| 5,808,558 A | 9/1998 | Meek et al. | |
| 5,808,902 A | 9/1998 | Levert et al. | |
| 5,995,911 A | 11/1999 | Hart | |
| 6,026,355 A | 2/2000 | Rahman et al. | |
| 6,058,354 A | 5/2000 | Adame et al. | |
| 6,061,609 A | 5/2000 | Kanoi et al. | |
| 6,088,688 A | 7/2000 | Crooks et al. | |
| 6,107,791 A | 8/2000 | Lee | |
| 6,154,023 A | 11/2000 | Durand | |
| 6,229,451 B1 | 5/2001 | Brown | |
| 6,236,332 B1 * | 5/2001 | Conkright et al. | 340/3.1 |
| 6,291,986 B1 | 9/2001 | Sorensen | |
| 6,311,105 B1 | 10/2001 | Budike, Jr. | |

* cited by examiner

METHOD FOR MONITORING POWER AND CURRENT FLOW

A portion of the disclosure of this patent document contains material that is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

FIELD OF THE INVENTION

The present invention relates to a method and apparatus for the measuring of power and current flowing through transmission lines, and of the power generation or consumption of a facility.

BACKGROUND OF THE INVENTION

As the traditional monopolies of electric utilities have been relaxed in the United States, there has developed a growing market in wholesale electric energy. Utilities, independent power producers, and power marketers are some of the participants in this volatile market. Among other variables, such as time of day and year, and temperature, electricity pricing in a given region is dependent on the operational status of the electric generation and use facilities in that region, and the transmission capacity of critical transmission paths.

Participants in the electric power markets, accordingly, would find real-time information on the operational status of important generation, use, and transmission facilities in a region to be useful in developing trading strategies and responses to power system events. Likewise, relaxation of the monopoly status of traditional utilities has resulted in increased competition for customers amongst suppliers of electric energy. Information on the electric power use of potential customers would be useful to those involved in bidding for electricity supply contracts. It would be further advantageous to determine information on the supply and demand of electric energy without having to directly connect to the transmission and distribution lines conducting electric energy.

It is, therefore, an object of the present invention to provide a methodology whereby real-time information on transmission line power flow, generation facility power output, substation power input and output, and facility power use may be obtained remotely and transmitted to an end-user of such information. It is also an object of this invention to provide an apparatus capable of accomplishing this task. It is a further object of this invention to collect and provide this information accurately, regardless of changing environmental conditions, over the long-term, and with a minimum of human involvement. Furthermore, it is an object of this invention to provide this information to an end-user in such a form as to permit the end-user to act in a logical and timely fashion to real-time events on the power system.

SUMMARY OF THE INVENTION

Towards the accomplishment of these objects, disclosed is a method for determining in real-time the net electric power and current either generated or consumed by a facility or substation, and the electric power and current transported by an electric transmission line. This is accomplished, in part, through the use of one or more apparatuses for monitoring the magnitude and direction of electric power or current flow in a single electric current carrying conductor or in multiple current carrying conductors operating in a poly-phase arrangement. The present invention thus relates generally to a method and apparatus for the long-term, real-time, remote monitoring of the electric power and current flow to, from, or in a monitored facility.

For the purpose of the following discussion, the terms "transmission line" and "electrical line" will generally refer to a set of at least three conductors operated in a poly-phase arrangement for the purpose of transmitting electric energy. Each of the three conductors comprising the transmission line is energized with a sinusoidal voltage 120 degrees out of phase with the other two conductors comprising the transmission line. "Bundled" conductors, which consist of multiple wires in close proximity to one another that are operated electrically in parallel, will be referred to and treated as a single conductor.

Current and power monitoring according to the present invention may be accomplished by placing one or more of the apparatuses described herein in proximity to each of the electrical transmission lines that provide service to a monitored facility. Generally, it is desired that an apparatus be located within approximately 200 feet of the monitored line, though the actual location of the apparatus is dependent on terrain, line geometry, and other factors unique to the particular line. It is to be understood that the present invention may be used to measure characteristics from single or multiple lines, instead of a facility.

Each individual apparatus transduces magnetic fields emanating from the monitored power line and determines the phase relationship to another signal that is synchronized to power system frequency. This signal, in an exemplary embodiment, may be the electric field emanating from the monitored line. It may also be a measure of the voltage derived from some electrical connection to the power system such as that obtained from an electrical wall outlet. By this synchronization, a measure of the direction of current flow in the line is determined. Because any given distribution or transmission line is operated at near uniform voltage, a measure of the current flow in a line is also a measure of the complex power flow in the line. The power flow can be divided into its real and reactive components through use of the phase angle relationship between the monitored magnetic fields and the synchronized signal.

Standard transmission or distribution lines typically consist of at least three current carrying conductors. Multiple monitoring devices devoted to each line may give increased sensitivity in determining the current flow in the individual conductors using methods such as that described in U.S. Pat. No. 5,438,256, the disclosure of which is hereby incorporated by reference. However, because the method of operation of most transmission lines is predictable, it is possible to monitor a single poly-phase line with a single apparatus, as disclosed herein. Furthermore, multiple poly-phase circuits that are carried on the same transmission structure may be individually monitored using the apparatus and methods disclosed herein.

In an exemplary embodiment of the present invention, magnetic fields may be transduced either through the use of coil probes or Hall effect sensors. Electric fields may be transduced through the use of a free-body meter, or a ground-reference type meter, as described in IEEE Standard 644-1994.

After transduction, signals representing the electric and magnetic field strength may be magnified and filtered. The magnitudes and relative phase angles of these signals are then converted to digital signals, evaluated, and, in an exemplary embodiment, stored by use of a microcontroller or microprocessor, at least one analog to digital (A/D) converter, and digital memory. The microprocessor may be programmed to analyze and record the data received through the A/D converter.

Included in an exemplary embodiment of the apparatus according to the present invention is a device that permits communication between the remote apparatus and a central computing facility. This communication device may comprise, for example, a cellular telephone and modem connected to the microcontroller. Similarly, a radio-frequency, or microwave connection may be made between the apparatus and the central computing facility. Satellite communication between the apparatus and the computing facility is also realizable. Algorithms in the microcontroller determine when and if the apparatus should communicate with the central computing facility, or provide some other form of communication, such as an event-notification alarm, directly to an end-user.

Where environmental concerns exist, the apparatus may include an enclosure that protects the components of the apparatus from the elements. This enclosure may be constructed of material that will not interfere with the strength or the measurement of electric or magnetic fields, such as wood, fiberglass, plastic, or the like. Likewise, if low temperatures are likely to interfere with proper operation of the apparatus, a heating element may be included in the enclosure. The apparatus may be battery powered and may include a solar charger to permit long-term, unattended operation.

The central computing facility may be comprised of a digital computer such as a typical PC and at least one communications device. The central computing facility receives communications from all of the remote apparatuses monitoring a facility, facilities, line, or lines under measurement. The data received from the apparatuses is processed to determine the magnitude and direction of current and power flow in each monitored line. The net power and current flow into or out of the facility may then be calculated as the sum of the individual line flows. Once computed, the net facility power-use or generation, as well as the power and current flows in individual lines can be transmitted in a secured fashion to the end-user. This communication could be made via a direct computer-computer connection, a digital pager, Internet, LAN, WAN, or the like. The central computing facility may provide additional communications such as event-notification-alarms after the recorded data has been analyzed and found to meet certain prescribed conditions.

In a broad aspect, the present invention may include an apparatus for remotely measuring current in an electrical line (or lines) comprising: a magnetic transducer to convert the magnetic field of the current at a remote location, into a magnetically transduced signal; and a first conditioning circuitry coupled to the magnetic transducer to prepare the magnetically transduced signal for analysis. In an exemplary embodiment, the conditioning circuitry may include some or all of the following elements: an amplifier(s); a filter(s), a rectifier(s), all of which may be serially coupled. Of course, multiple apparatuses may be used to measure a plurality of lines.

In exemplary embodiments, the apparatus may also include an electrical transducer to convert the electric field of the line at the remote location into a reference signal; and second conditioning circuitry coupled to the electrical transducer to prepare the reference signal for analysis. Alternately, the reference signal may be synchronized to a frequency of a power system connected to the line. Also, the present invention may include one or more measuring circuits coupled to the conditioning circuits to evaluate magnitude of the magnetically transduced signal and/or phase angle between the magnetic field and reference signal.

Further, an apparatus according to the present invention may include additional elements, including a data storage device to store data, one or more communication devices to transmit the data to a central facility (for processing, maintenance, or further distribution) and/or end users. In exemplary embodiments, the magnetic transducer may comprise a coil probe or a Hall effect sensor, and the electrical transducer may comprise a free-body meter or a ground-reference meter.

Another broad aspect of the present invention includes a method for remotely measuring current in an electrical line (or lines), comprising the steps of placing one or more apparatuses including a magnetic transducer in proximity to the line; receiving magnetic field emanating from the electrical line with the magnetic transducer; and processing the magnetic field to determine a magnitude of the current. Data representative of the magnetic field may be relayed to a central station for some or all of the processing. Further, information representative of the current (i.e., magnitude and/or direction) may be transmitted (via different mediums including, fax, computer, modem, Internet, LAN, WAN, or the like) to an end user.

In addition to the magnetic field, an electrical signal synchronized to a frequency of a power system connected to the line (which may be an electric field emanating from the line, or it may be obtained from a wall outlet), for example) may be received and used to determine a phase angle between the magnetic field and the electrical signal to ascertain the current's direction.

In certain embodiments, the line may be coupled to a facility, and the information informs the end user of power consumption or power generation of the facility (including net current power flow in a plurality of lines connected thereto).

It has only been recently that there have developed markets for the wholesale trading of electric energy. The power marketers, independent power producers, and others who participate in this market are finding that transmission line loading and the operational status of electric generation and use facilities in a region are important in determining the price and quantity of electricity traded in a region. Access to such information is limited. Utilities operating power systems have always required precise knowledge of transmission line current and power flows, and facility power usage or generation in order to best operate the power system. These utilities have access to the conductors comprising the transmission lines and the equipment to which they are connected. Consequently, systems have been developed that attach directly to electrical line conductors and measure very precisely the current and power flow in the conductor. However, generally, the information from these systems is withheld from market participants.

Because the electric power markets are dependent on the physical status of important facilities and lines, there is a clear market need for the collection and dissemination of operational information regarding said lines and facilities. One of the objects of the present invention is to provide a system to allow the collection and transmission of such information to market participants without connecting to the utility system or requiring the placement of equipment in utility right-of-ways or easements. The present invention accomplishes this by disclosing an apparatus that may be located a distance from a transmission line under surveillance to be used to measure remotely the current or power flow. The method by which information from such an apparatus is used to determine the transmission line current is also disclosed. Additionally, the present invention describes a method for using such information to determine the net power generation or use (or current flow) to or from a monitored facility. All of this information is collected in an automated way that allows for a minimum of required human intervention and is thus well-suited for the long-term, real-time collection of information desired by power market participants. The information may be centrally collected, processed, and then sent in a useful form to a plurality of market participants.

Given the ease of computer to computer communications and the familiarity that market participants already have with computer based information systems, such information may be sent via the Internet, or a LAN, WAN, or the like, to a computer where such information could be displayed to an end-user. The end-user could choose to dedicate a computer monitor or monitors to the display of such information. The system may allow the end-user to view a graph of the power and current flow in a particular transmission line, or set of transmission lines. Similarly, the system may allow the end-user to monitor a graph of the flow of power into or out of a monitored facility or facilities. Such information could be viewed as the information is updated. The system may also provide the end-user a "snap-shot" view of the operational status of lines or facilities at a single moment in time. Information may be stored so that historical patterns and trends could be used to develop trading strategies.

Events, such as the outage of a generation, transmission, or use facility, unexpected or otherwise, may be highlighted to the end-user through the use of event notification alarms sent either from the central computing facility, or directly from the distributed monitors. A transmission line reaching its operational limits might also result in an alarm. Such alarms could consist of computerized audible and/or visual warning on the dedicated monitor(s). Additionally, warnings could be sent to a pager or telephone. The alarms could inform the end-user of the date, time and nature of the event.

Information updates to the end-user may be dependent on the transmission of data from the distributed monitors to the central computing facility. Data from an individual monitor may be sent either continuously or after a fixed amount of time has transpired since the last data transmission. Additionally, the monitor may be programmed to transmit data when other conditions are met such as a rapid change in the collected data or the penetration of some threshold. For example, the monitor might immediately transmit data when this data falls below a threshold value suggestive of a transmission line outage. The data may also be processed by the central computing facility to immediately transmit the location and nature of the event and its significance to the end-user, allowing the end-user to act on this knowledge in a timely fashion. Likewise, the end-user may have the option of requesting information from a particular monitor or set of monitors.

Through the use of state-estimation techniques, the power flow information collected by multiple monitoring apparatuses may be used to predict or estimate the power flow, generation, or consumption in other parts of the power system not directly monitored by these apparatuses. State-estimation is a mathematical process and may be performed at the central computing facility. The results can then be transmitted to an end-user of this information. An apparatus in accord with the present invention may also be used to measure, at a given location from a line, the strength of the magnetic field emanating from the line. Such information may be useful, as long-term exposure to magnetic fields may raise health concerns.

DESCRIPTION OF ILLUSTRATIVE EMBODIMENTS

Figure 3:
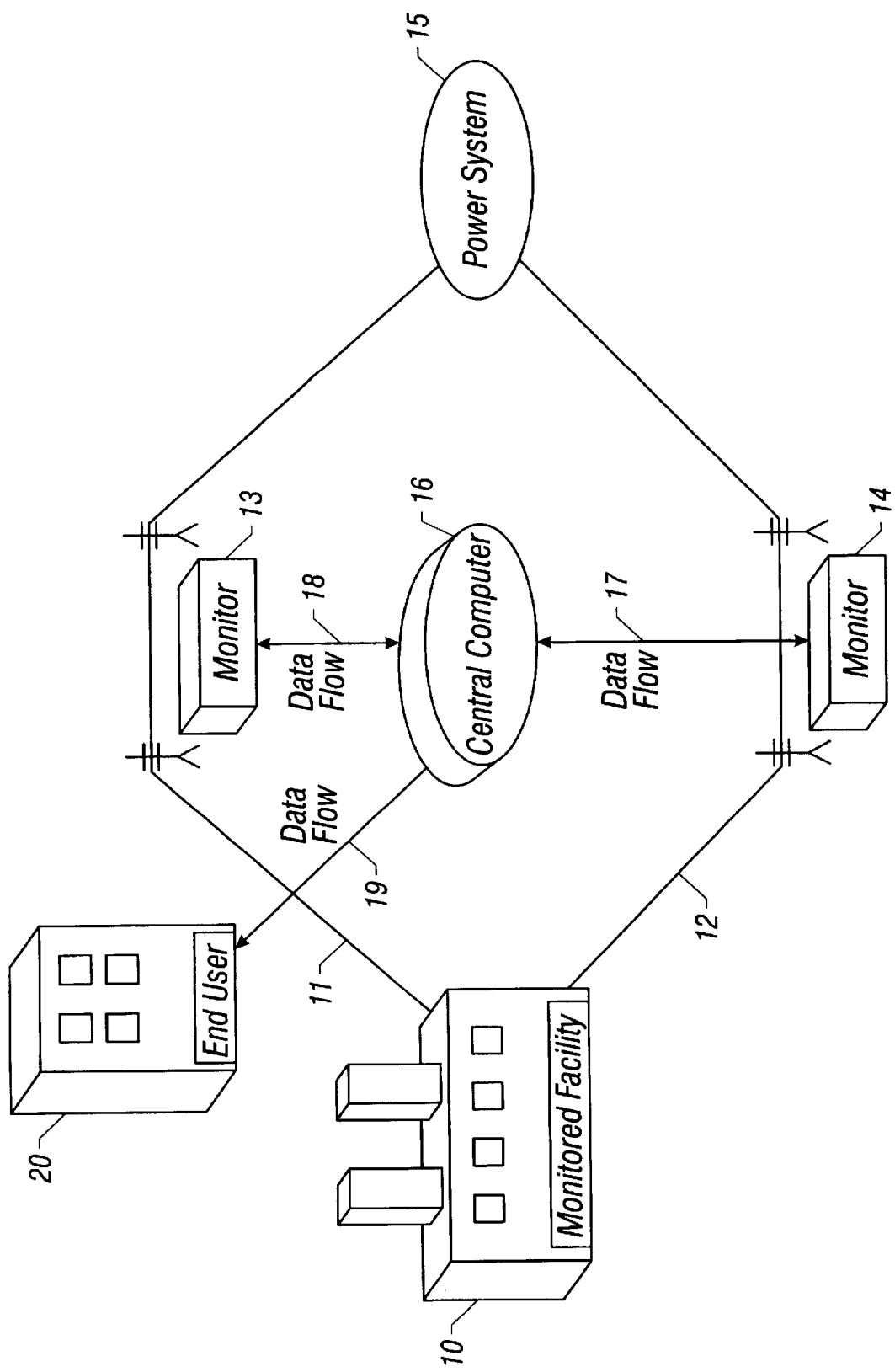
FIG. 3 is a block diagram of an exemplary embodiment of a system according to the present invention.

Referring to FIG. 3, there is shown a facility, 10, whose electric power generation or use is to be monitored. In typical uses of the present invention, facility 10 may be an electric generation plant, manufacturing plant, office building, substation or any other power consuming or generating environment. This facility is connected to the electric power system 15, by electrical transmission (or distribution) lines 11 and 12. Lines 11 and 12 provide electrical service, typically at 60 Hz. The power system 15 consists of the network of electrical conductors, loads, and generators connected to provide or utilize electrical service in a region. Generally each transmission line will be comprised of three separate conductors, the voltage of each varying sinusoidally at the same, or nearly the same, peak value. The voltage between each conductor and ground differs by 120 degrees (of power-line operating frequency) in phase from that of the other conductors. As discussed, the monitored facility 10 may either be consuming, generating electric power or both, though the net generation or consumption is to be monitored.

To perform the methods of the present invention, apparatuses according to the present invention, shown here as monitors 13 and 14, are placed in proximity to lines 11 and 12. Generally, these apparatuses will be placed within approximately 200 feet of the lines to be monitored. Specific placement is dependent on a number of factors unique to the particular line being monitored including line geometry, terrain and obstructions. For example, to monitor a line in a dense urban area, the apparatus may be located more closely to the line than if the monitored line were located in a field, free of obstructions that could interfere with the electromagnetic signals emanating from the line. It is desirable to place the apparatus in such a position that the power frequency signals transduced by the device can be certain to be derived from the monitored line. This generally means locating the device within a lateral distance of 100 feet, and more specifically 60 feet, of the monitored lines. The monitors 13 and 14 record information on the electromagnetic fields generated by the voltages and currents associated with the respective lines.

As discussed in more detail herein, monitors 13 and 14 each include a transducer (not shown in FIG. 3) to measure the electric and magnetic fields emanating from the power lines and convert them into a transduced signal. Also, the monitors may include signal conditioners to condition the transduced signals, including filtering and amplification of the signals. The monitors 13 and 14, may also include a microprocessor (not shown in FIG. 3) with digital memory that permits the analysis and storage of collected data associated with the electromagnetic fields. The microprocessor may be connected to communications equipment and may be programmed to transmit information related to the field strengths and relative phase angles (represented by data flow 17 and 18), to a central computing facility 16. The microprocessor may also be programmed to determine when, and under what conditions, data transmission should occur. Alternatively, data may also be transmitted directly from the monitors to the end-user of the information, shown in FIG. 3 at location 20. Data transmission from the monitors 13 and 14 may be accomplished through the use of a cellular telephone and modem. Data transmission could also be accomplished using a radio-frequency (RF), microwave, land-line telephone, or satellite communications link. The central computing facility 16 is comprised of a digital computer, such as a PC, connected to a communications device such as a modem. It is to be understood that other apparatus may be used in addition to or in place of the PC at the central facility 16, such as a network of computers or the like.

The computing facility 16 processes data from monitors 13 and 14 and determines the flow of current and power in lines 11 and 12 by calculation. The computing facility 16 also determines, by calculation, the net flow of current and power into and out of the monitored facility 10. It is to be understood that in alternate embodiments, the processing may occur within the monitors themselves or by the end-user, thus obviating the need for a computing facility 16.

Using state-estimation techniques and the data from the monitors 13 and 14, the central computing facility 16 can also estimate power flows, generation and consumption at points on the power system 15 not specifically monitored by the apparatuses. Some, or all, of this information is then transmitted (as represented by data-flow 19) to the end-user of the information at location 20. The end-user includes anyone for whom information about the power flows in lines 11 or 12 or the net power use of facility 10 is useful. End-users may include, for example, power marketers, energy traders, energy producers, or energy consumers. It is to be understood, of course, that information may be provided to a plurality of end users or locations. Information is transmitted from central facility 16 to the end-user's location 20 via some form of communications equipment such as the Internet, modem and telephone, direct computer-computer connection, LAN, WAN, by modem and pager, or the like.

Power systems are operated at a fixed nominal frequency about which only small deviations in frequency are permitted. In the United States, this nominal frequency is 60 Hz. Discussion will be limited to currents and voltages at or near nominal power system frequency. It is also to be understood that the following discussion assumes that, at the monitor location, the transmission or distribution lines under surveillance are the principal source of power frequency magnetic and electric fields. Sensors are physically removed from other magnetic and electric field sources such as electrical power lines not under surveillance.

Figure 4:
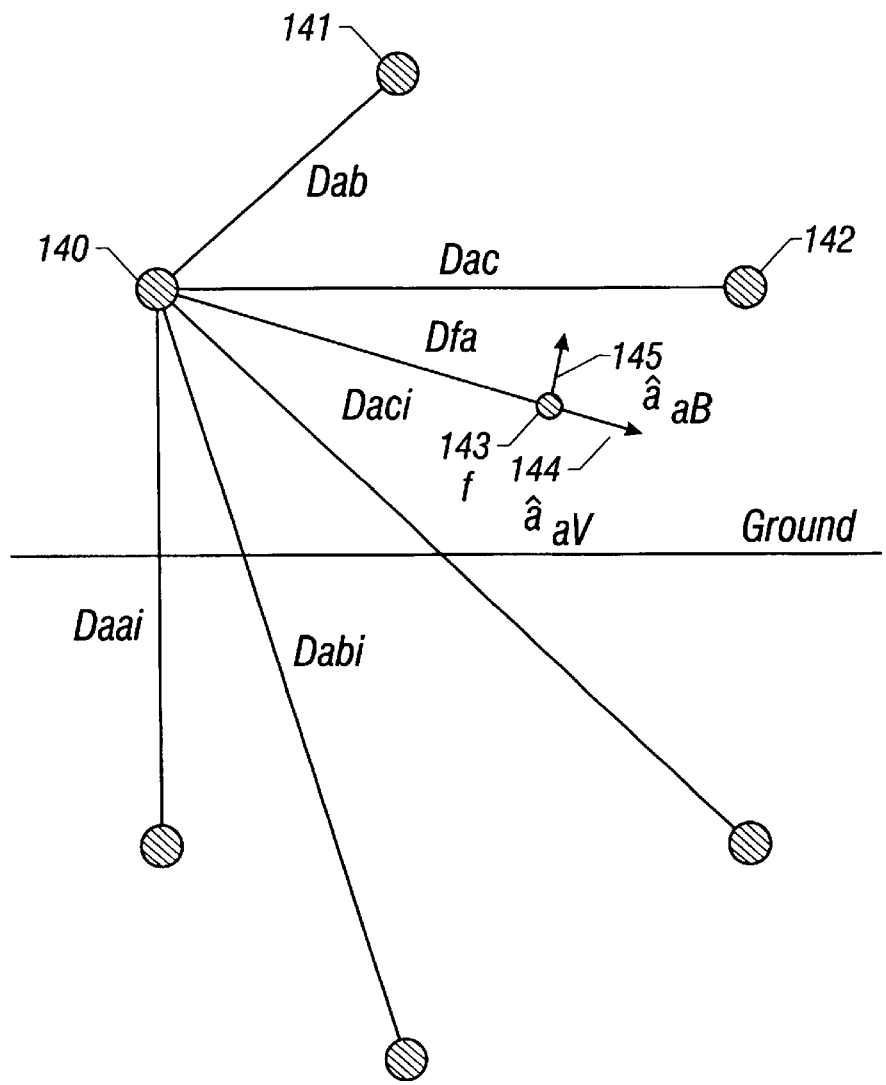
FIG. 4 is a representation of conductors comprising a transmission line and the image conductors used for the purposes of computing electric and magnetic fields. Also represented are vectors representing the direction of electric and magnetic fields emanating from one conductor.

In order to understand the means by which current and power flow is calculated by the central facility 16 it is necessary to refer to FIG. 4, which depicts a generalized arrangement of three conductors, 140, 141, 142, comprising a typical transmission line. Nominally, during steady-state operation, the voltages between each of the conductors and ground vary sinusoidally with equal magnitude. The voltage between each conductor and ground differs from that of the other two conductors by 120 degrees in phase. Each conductor develops a charge that generates an electric field that is directed radially from the conductor.

During steady-state operation, the electric fields emanating from the individual conductors vary sinusoidally at power frequency. At a given point in space, the net electric field is the vector sum of the electric fields generated by the conductors (and, as we shall see later, the conductor images) and is itself a sinusoid. During steady-state operation, the voltage magnitudes of the phase conductors to ground, and the phase difference between conductor voltages, vary only minimally. Thus, the net electric field at a point in space away from the monitored line can act as a fixed reference signal synchronized to power system frequency.

The net electric field generated by a transmission line at a point in space is computed as follows. A single conductor h meters over the earth is modeled electrically as a line charge of q coulombs/meter with an image line charge located h meters beneath the earth with charge –q coulombs/meter. The relationship between conductor voltage to ground (Vag) and line charge is given in EQ. 1, $$V_{ag} = \frac{q}{2\pi\varepsilon_0}\ln\left(\frac{2h}{r}\right)V, \qquad \text{EQ. 1}$$

where $\varepsilon_0$ is the permittivity of free space and r is the radius of the conductor. By superposition the voltage-charge relationships between multiple conductors over earth are computed as follows. In the case of three conductors labeled a, b, and c (indicated in FIG. 4 as 140, 141, and 142) comprising a single transmission line over earth, $$V_{ag} = \frac{1}{2\pi\varepsilon_0}\left[q_a\ln\frac{D_{aai}}{r_a} + q_b\ln\frac{D_{abi}}{D_{ab}} + q_b\ln\frac{D_{aci}}{D_{ac}}\right]V, \qquad \text{EQ. 2}$$

where, $D_{aai}$: distance in meters from conductor a to its image, $D_{abi}$: distance in meters from conductor a to the image of conductor b, $D_{aci}$: distance in meters from conductor a to the image of conductor c, $D_{ab}$: distance in meters from conductor a to conductor b, $D_{ac}$: distance in meters from conductor a to conductor c.

All measurements of distance in EQ. 2 and following are made in the plane normal to the transmission line.

In matrix form, the voltage-charge relationship between all conductors is, $$\begin{bmatrix} |V|\hat{a}_{aV} \\ |V|\hat{a}_{bV} \\ |V|\hat{a}_{cV} \end{bmatrix} = \frac{1}{2\pi\varepsilon_0} \begin{bmatrix} p_{aa} & p_{ab} & p_{ac} \\ p_{ba} & p_{bb} & p_{bc} \\ p_{ca} & p_{cb} & p_{cc} \end{bmatrix} \begin{bmatrix} q_a \\ q_b \\ q_c \end{bmatrix} \text{Volts}, \quad \text{EQ. 3}$$

where,
$|V|$: is the magnitude of conductor voltage to ground
$\hat{a}_{xV}$: is the unit phasor in phase with the voltage between conductor x (x=a, b, or c) and ground, and $$p_{aa} = \ln\frac{D_{aai}}{r_a}, \; p_{ab} = \ln\frac{D_{abi}}{D_{ab}}, \; p_{ac} = \ln\frac{D_{aci}}{D_{ac}}, \text{ etc.}$$

Alternatively, EQ. 3 can be written more simply as $$V_{abc} = \frac{1}{2\pi\varepsilon_0} P_{abc} Q_{abc} V. \quad \text{EQ. 4}$$

The elements comprising $V_{abc}$ are phasors.
Solving for $Q_{abc}$, $$Q_{abc} = 2\pi\varepsilon_0 V_{abc} P_{abc}^{-1} \quad \text{EQ. 5}$$

yields a phasor solution for the line charges. The electric field at any point in space f is then computed from EQ 6. using the line charge information computed in EQ. 5 as follows, $$\vec{E}_f = \frac{1}{2\pi\varepsilon_0}\left[q_a\left(\frac{\hat{a}_{aV}}{D_{fa}} - \frac{\hat{a}_{ai}}{D_{fai}}\right) + q_b\left(\frac{\hat{a}_{bV}}{D_{fb}} - \frac{\hat{a}_{bi}}{D_{fbi}}\right) + q_c\left(\frac{\hat{a}_{cV}}{D_{fc}} - \frac{\hat{a}_{ci}}{D_{fci}}\right)\right] \quad \text{EQ. 6}$$

$V/m,$ where,
$\hat{a}_{xV}$: is the unit vector directed from conductor x to point f (e.g. $\hat{a}_{aV}$ is labeled 144 in FIG. 4),
$\hat{a}_{xi}$: is the unit vector directed from the image of conductor x (x=a, b, or c) to point f,
$D_{fx}$: is the distance in meters from point f to conductor x (x=a, b, or c),
$D_{fxi}$: is the distance in meters from point f to the image of conductor x (x=a, b, or c),
$q_x$: is the phasor representation of line charge on conductor x, (x=a, b, or c) as computed from EQ 5.

EQ. 6 yields a phasor representing the sinusoidal variation of electric field at the point in space f (labeled 143 in FIG. 4). This phasor is phase angle referenced to the same reference as conductor voltage to ground. Electric field is also a vector quantity.

Thus, it is possible, given the spatial geometry of the line, the phase relationship of the conductors, and the voltage magnitude at which the line is operated to calculate the net electric field generated by the line at a general point in space. For instances where ground lines or other conductors are present, the process for solving electric field is the same. The order of the matrices increases accordingly. Large objects such as trees, transmission line structures, and fences affect electric field magnitude and phase angle. Thus, if it is important that the above equations accurately predict electric field magnitude and phase angle, care should be taken to make such measurements away from such objects.

Likewise, the current flowing in each conductor generates a magnetic field related to the magnitude of current flow. The net magnetic field at power frequency at a specific point in space is a function of the line geometry, the relative position of the point in question to the line, and the magnitude and phase angle relationships of the currents in the overhead conductors.

Specifically, the magnetic field emanating from a single transmission line can be computed as follows. A current I conducted by a long straight wire generates magnetic flux density, $\vec{B}_f$, at a point f a distance p meters, from the wire according to EQ. 7.

$$\vec{B}_f = \mu_0 \frac{I}{2\pi\rho} \hat{a}_\phi T, \quad \text{EQ. 7}$$

where,
$\hat{a}_\phi$: is the cross product of the unit vector directed parallel to current flow and the unit vector perpendicular to current flow that is directed to the point f, and
$\mu_0$: is the permeability of free space.

When solving for the net magnetic field generated by a set of multiple current carrying conductors, it is possible to account for the return currents associated with the overhead conductor currents using the method of complex images. The image distances, however, are usually located on the order of hundreds of meters beneath the ground plane and thus contribute negligibly to the magnetic field strength near most lines. The principle of superposition applies to the computation of the magnetic field resulting from a transmission line. Thus, neglecting the return currents, the magnetic flux density at a point f resulting from current flows in the multiple overhead conductors depicted in FIG. 4 is given by EQ. 8.

$$\vec{B}_f = \frac{\mu_0}{2\pi}\left(\frac{\vec{I}_a}{D_{fa}}\hat{a}_{aB} + \frac{\vec{I}_b}{D_{fb}}\hat{a}_{bB} + \frac{\vec{I}_c}{D_{fc}}\hat{a}_{cB}\right)T \quad \text{EQ. 8}$$

where,
$\vec{I}_x$: is the phasor current in conductor x (x=a, b, or c),
$D_{fx}$: is the radial distance from conductor x (x=a, b, or c) to the point f as defined earlier and in FIG. 4,
$\hat{a}_{xB}$: is the cross product of the unit vector directed parallel to current flow in conductor x (x=a, b, or c) and the unit vector perpendicular to this current flow that is directed to the point f (e.g. $\hat{a}_{aB}$ is labeled 145 in FIG. 4).

Typically, the currents $\vec{I}_x$ of EQ. 8 are sinusoids. It is customary to perform the arithmetic of EQ. 8 using phasor representations of the currents. Thus, the magnetic flux density is computed to be a time varying sinusoid. Magnetic flux density is also a vector quantity. It is desirable to operate the line in a "balanced" fashion, in which, at power frequency, the currents in each of the conductors are nearly equal in magnitude and vary in phase by 120 degrees from the others. Assuming balanced operation, EQ. 8 reduces to EQ. 9.

$$\vec{B}_f = \frac{\mu_0 |I|}{2\pi}\left(\frac{\hat{a}_{aI}\hat{a}_{aB}}{D_{fa}} + \frac{\hat{a}_{bI}\hat{a}_{bB}}{D_{fb}} + \frac{\hat{a}_{cI}\hat{a}_{cB}}{D_{fc}}\right)T, \quad \text{EQ. 9}$$

where,
$|I|$: is the magnitude of current flow in each conductor,
$\hat{a}_{xI}$: is the unit phasor in phase with the current in conductor x (x=a, b, or c).

In the case where a single transmission line is the source of magnetic field, the measurement of magnetic field at a single location (and in a single orientation) can be used in conjunction with EQ. 9 to solve for current flow in the line. Precise measurements of the relative positions of the conductors comprising the line and the position of magnetic field measurement are required and can be obtained with a measuring tape, and transit. The measurement of magnetic field may be accomplished through the use of a single coil probe oriented in a known direction relative to the transmission line.

When two different transmission lines, transmission line 1 and transmission line 2, are in close proximity to one another, such as is the case when a single transmission structure supports two different lines, the relationship between transmission line currents and magnetic fields is described by EQ. 10, $$\vec{B}_f = \frac{\mu_0}{2\pi} \left[ \begin{array}{c} |I_1| \left( \frac{\bar{a}_{a l 1} \hat{a}_{aB1}}{D_{fa1}} + \frac{\bar{a}_{b l 1} \hat{a}_{bB1}}{D_{fb1}} + \frac{\bar{a}_{c l 1} \hat{a}_{cB1}}{D_{fc1}} \right) + \\ |I_2| \left( \frac{\bar{a}_{a l 2} \hat{a}_{aB2}}{D_{fa2}} + \frac{\bar{a}_{b l 2} \hat{a}_{bB2}}{D_{fb2}} + \frac{\bar{a}_{c l 2} \hat{a}_{cB2}}{D_{fc2}} \right) \end{array} \right] T,$$ EQ. 10 where, the subscripts 1 or 2 distinguish between transmission lines 1 and 2 respectively. In this instance, two simultaneous measurements of magnetic field intensity must be taken to solve for the two line currents. Because magnetic field is a vector quantity, it is possible, by separating the magnetic field (as described in EQ 10.) into spatially orthogonal components, to generate two equations that can be solved to determine the magnitude of current flow in the two lines. The two measurements of magnetic field required to solve EQ. 10 for current may be obtained through the use of two coil probes, each designed to transduce magnetic field along a single axis. Care should be taken to ensure that the sensors are positioned and oriented so as to yield two unique equations relating the current flows to magnetic field. Usually one probe will be oriented perpendicular to the plane of the earth and the other horizontal to the plane of the earth and perpendicular to the path of the transmission lines.

In general, the monitoring of n lines will require n magnetic field sensors. A single electric field sensor may act as a synchronized phase angle reference to all distributed magnetic field sensors. In the case of a single tower supporting two different transmission lines, it is possible to locate the two magnetic field sensors on opposite sides of the tower. The two sensors may be attached to one of the exemplary apparatuses described herein, or two different apparatuses may be employed to make the measurements. In the instance where only one apparatus is used with multiple probes, the probes may be directly connected electrically to the apparatus or a radio-frequency, microwave, optic, or some other such link could transmit magnetic field data from the sensor to the apparatus. Similarly, two orthogonally oriented coil probes located in roughly the same position could be directly attached to a single apparatus to provide the required magnetic field data.

For the case of two transmission lines in close proximity to one another, the current flow in each of the lines is determined by simultaneous solution of EQ. 10 at the two locations occupied by and in the two orientations of the magnetic field sensors. This requires precise knowledge of the position of the conductors comprising the transmission lines and the location of the sensors. These locations are determined using equipment that may include a range-finder, measuring tape, and transit. Knowledge of the phase angle relationships amongst the various conductor voltages and amongst the line currents is also required. These relationships are referred to as phasing.

Figure 5:
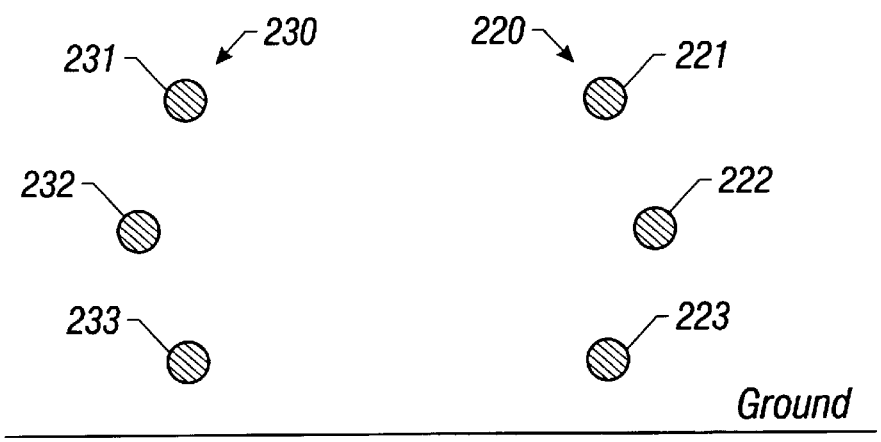
FIG. 5 is a representation of two transmission lines over the earth.

In the following discussion the ground beneath the transmission line in the plane perpendicular to the path of the line is assumed to be flat. Vertical magnetic field refers to the component of magnetic field perpendicular to the ground. Horizontal magnetic field refers to the component of magnetic field parallel to ground and perpendicular to the path of the transmission line. FIG. 5 depicts a generalized representation of two transmission lines 220, and 230 each comprised of individual phase conductors 221, 222, 223, and 231, 232, and 233, respectively. The perspective is looking down the length of the lines. The center is the point on the ground equidistant from lines 220 and 230. Current flow is assumed to be out of FIG. 5. Lateral distance in FIG. 5 increases from zero at the center to the right and decreases to the left. Phasing and loading information of the generalized lines 220 and 230 is obtained from the following process, which is an exemplary embodiment of a method according to the present invention.

Step 1: Following a path along the ground perpendicular to the transmission lines, measure the horizontal and vertical magnitudes of magnetic field. If possible, record only the 60 Hz component. The path should be roughly centered on the transmission lines and of 100 to 200 feet in length. Measurements should be made at a fixed height above ground. Use a device calibrated to display in $\mu$T. The Enertech Consultants Emdex II magnetic field recorder is a device suitable for this measurement. Record the magnitudes and positions at regular intervals, for example, every foot.

Step 2: Record the variation of magnetic field angle along the path traversed in Step 1. This is accomplished by first setting a single, stationary electric field probe in the vicinity of the line to provide a reference signal. (The electric field probe should be placed laterally within 20 feet of the transmission conductors and should be at least 3 feet above ground. The electric field probe could be comprised of two parallel conducting plates the voltage between the plates acting as a measure of electric field perpendicular to the plates. IEEE Std 644-1994 details the use and design of suitable electric field probes.) Magnetic field probes (e.g. coil probes) are then moved along the path described in Step 1. Accounting for phase shift introduced by transduction and signal conditioning, record, at regular intervals, for example every foot, the angles (in degrees of 60 Hz) that the horizontal and vertical magnetic fields lead the measured electric field. Record also the positions where the measurements are taken. The electric field probe should be connected electro-optically to whatever device effects the comparison.

Step 3: Measure and record the relative position of the conductors to one another and to the earth. Record the position of the electric field probe. These measurements can be accomplished using measuring tapes and a transit, or clinometer.

Step 4: Referring to FIG. 5., define line 1 to be 220 and line 2 to be 230. Define the phasors of EQ. 10 as follows, $\bar{a}_{aI1}=1\angle 0°$, $\bar{a}_{bI1}=1\angle -120°$, $\bar{a}_{cI1}=1\angle 120°$, and $\bar{a}_{aI2}=1\angle \theta°$, $\bar{a}_{bI2}=1\angle -120+\theta°$, $\bar{a}_{cI2}=1\angle 120+\theta°$. Arbitrarily assign the line 1 phasors to conductors (221, 222, 223, FIG. 5) and the line 2 phasors to conductors (231,232, 233, FIG. 5), respectively, to create balanced sets of current in the circuits 220 and 230, FIG. 5. For all unique combinations of transmission line conductor phasing so determined, compute the magnitudes of circuit currents and the phase angle $\theta$ between same-phase transmission currents in transmission lines 1 and 2 that yield a computed magnetic field profile that best fits the profiles measured in Step 1. This can be accomplished using the attached Visual Basic program PhaseFind (attached hereto as Appendix A). PhaseFind varies the conductor phasing, current magnitudes, and the phase angle between same-phase currents in the two circuits and determines the magnetic field at specific points in space using EQ. 10. PhaseFind requires an initial guess for the phase currents. Input values consistent with the fields measured in Step 1. If this does not work, apply different sets of initial current guesses until PhaseFind determines a solution.

Step 5: Determine from the scenarios examined in Step 4, the unique phasing/loading scenarios that yield reasonable fits to the measured data.

Step 6: For each phasing/loading scenario selected in Step 5, define conductor voltages to ground so that they are in phase with the phasors $\bar{a}_{xI1}$, and $\bar{a}_{XI2}$ (x=a, b, or c). Compute, using EQ. 10, for each scenario, the phase angles that vertical and horizontal magnetic fields lead the phasor $\hat{a}_{aI1}$, at points along the path described in Step 1. Compute similar angles for the component of electric field sensed in Step 2 using EQ. 6. Use the circuit geometry measured in Step 3. EBCalc, a Visual Basic program that generates suitable plots of magnetic and electric field phase angles, is attached (attached hereto as Appendix B).

Step 7: Compare the profiles of magnetic field angles measured in Step 2 to those computed in Step 6. Select the scenario that yields the best match to measured phase angle variation. It is permissible to add any angle to the measured data set (so long as the same angle is added to all recorded points) in order to better fit the computed data. (This effectively ignores any constant phase shift that is introduced by transduction, or conditioning, or that results from a phase angle difference between measured electric field and zero phase angle referenced voltage.) This particular phasing and loading scenario is assumed to be the actual phasing and circuit loading.

Step 8: Determine the angle φ that current leads phase-to-ground voltage in circuit 1 according to EQ. 11, $$\phi = (\theta_{MV} + \theta_{MH} - \theta_{CV} - \theta_{CH} + 2\theta_E)/2 \quad \text{EQ. 11}$$

where, $\theta_{MX}$: is the angle of magnetic field in the X=H (horizontal) or V (vertical) orientation at the location of the electric field probe (Step 2) as measured in Step 2.

$\theta_{CX}$: is the angle of magnetic field in the X=H (horizontal) or V (vertical) orientation at the location of the electric field probe (Step 2) as computed in Step 6.

$\theta_E$: is the angle of electric field in the orientation and at the location of the electric field probe (Step 2) as computed in Step 6.

Thus, the current magnitudes and phase angle relationships to conductor voltages are determined. If the phase angle between line current and voltage is not desired, the process above can be stopped after Step 7 and a would yield a measure of the current magnitudes and phasing, and phase angle between the two transmission line currents.

The same process may be followed for the case where a single transmission line is the source of electric and magnetic fields. In this case, Steps 4 and 6 assume only one line is the source of fields. In this case, the preceding steps could be followed to determine the current flow in the transmission line at a particular instant in time, $\vec{I}_i$, and EQ. 12 used to relate subsequent measurements of magnetic field to line current.

$$\vec{I} = \alpha \vec{S} \quad \text{EQ. 12}$$

where, $\vec{I}$: is the current flow in the transmission line, $\vec{S}$: is the measure of magnetic field determined from the apparatus, and, α: is the complex constant $\vec{I}_i/\vec{S}_i$, where, $\vec{S}_i$: is the measure of magnetic field made by the apparatus at a time corresponding to $\vec{I}_i$.

In the case of a single transmission line, phasing is not important in determining the magnitude of current flow. Consequently, if the magnitude of current flow is all that is desired, Step 1 and the PhFind program may be used to determine the magnitude of transmission line current. The magnitudes of both sides of EQ. 12 could be equated and the resulting equation would relate subsequent measurements of magnetic field magnitude to current magnitude. For the single line case, the phase angle between current magnetic and electric field, in the absence of electromagnetic disturbances external to the transmission line, varies in a one-to-one relationship with the phase angle relationship between conductor current and conductor voltage to ground.

As stated earlier, for the case where two transmission lines are the sources of electric and magnetic fields, two simultaneous measurements of magnetic field are required to compute the current in the transmission lines. These measurements can be made by two sensors attached to one of the exemplary apparatuses described herein, or by two different exemplary apparatuses placed in the vicinity of the lines. The sensors or devices are placed in different, known locations relative to the transmission lines. The monitors, as will be detailed later, give measures of the magnitude of magnetic field and the angle by which magnetic field leads electric field at the probe position. EQ. 13 relates the relationship between measurements recorded by the monitor (s) and transmission line currents.

$$\begin{bmatrix} C_1 S_1 \\ C_2 S_2 \end{bmatrix} = \begin{bmatrix} \alpha_1 & \beta_1 \\ \alpha_2 & \beta_2 \end{bmatrix} \begin{bmatrix} I_1 \\ I_2 \end{bmatrix} \quad \text{EQ. 13}$$

where, $S_1$, $S_2$: are the phasor measures of magnetic field as determined by the apparatus. They are phase angle referenced to some fixed signal, and subscripts 1 and 2 refer to the transducers located at, and oriented in positions 1 and 2 respectively, $\alpha_1$, $\alpha_2$: are the constant phasors (as detailed in EQ. 10) that relate the current in transmission line 1 to the net magnetic field (of the orientation measured by transducers 1 and 2) generated at measurement positions 1 and 2 respectively, $\beta_1$, $\beta_2$: are the constant phasors (as detailed in EQ. 10) that relate the current in transmission line 2 to the net magnetic field (of the orientation measured by transducers 1 and 2) generated at measurement positions 1 and 2 respectively, $C_1$, $C_2$: are calibration constants (phasor), $I_1$, $I_2$: are the phasor currents (that may be phase referenced to conductor voltage) flowing in lines 1 and 2 respectively.

The calibration constants $C_1$, $C_2$ are determined from EQ. 13 after first computing the constants α, β, and the conductor currents $I_1$, and $I_2$ from the process described in Steps 1–8. Henceforth, the line currents are determined from EQ. 12 and subsequent measurements of magnetic field $S_1$ and $S_2$. If the phase angle between conductor current and line to ground voltage was not obtained from Steps 1–8 an approximation of transmission line currents may be obtained. Assuming a value of the phase angle between transmission line current 1 and conductor voltage, and then advancing the second transmission line current by θ as determined in Step 7 allows the solution of EQ. 13 for currents as before.

The central computer 16 of FIG. 3, may, in an exemplary embodiment, perform the calculations described above according to the particular algorithm chosen to relate magnetic and electric field measurements to transmission line voltage and current. Because the nominal transmission line voltage peak is known, the central computer 16 may calculate the real and reactive power flow in the monitored lines from the magnitude of current flow and its phase angle relationship to voltage. Some, or all of these computations could be performed by the microcontroller located on-board the apparatus.

The electrical power dynamics of a facility refer to the flow or flows of current or power into or out of a facility. This flow or these flows may be in one or more electrical lines connecting the facility to the power system that supplies electric service to the facility. The term may also refer to the net flows into or out of the facility amongst any combination of lines supplying electrical service to the facility. The central computing facility may perform the computation of the electrical power dynamics from the data transmitted from the distributed apparatus or apparatuses.

Figure 6:
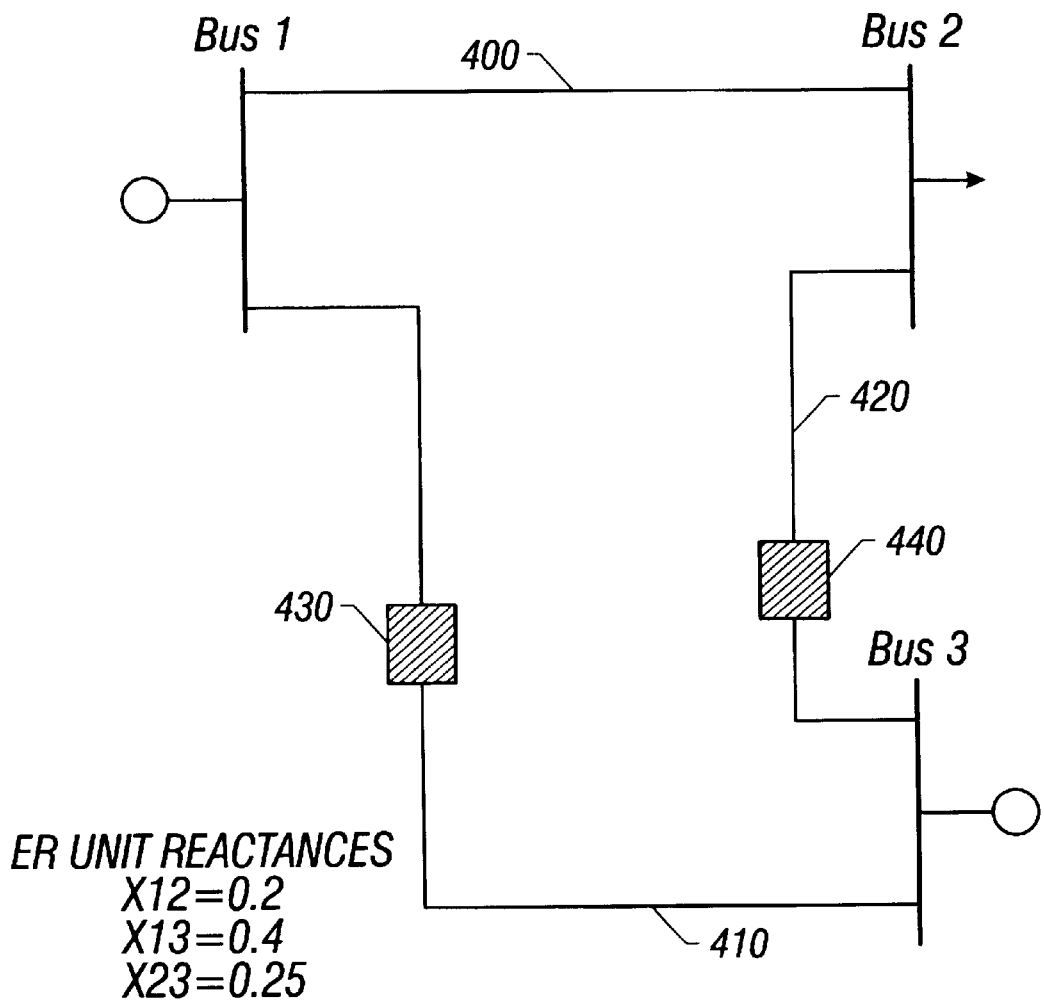
FIG. 6 is a block diagram of a simple three-bus system for the purpose of illustrating state estimation techniques.

The central computing facility 16 of FIG. 3 may also use the data transmitted from the distributed monitors 13, and 14 (FIG. 3) to deduce power flows in transmission lines not directly monitored. *Power Generation, Operation and Control* by Wood and Woolenberg, [2] offers a simple example of state estimation of unmonitored line flows from monitored line flows. Referring to the three bus power system shown in FIG. 6, monitors in accordance with the present invention are placed so as to permit a central computing facility to determine the current and power flows in transmission lines 410 and 420 (FIG. 6.). Per-unit reactances of the transmission lines are, respectively, $x_{13}=0.2$; $x_{13}=0.4$; and $x_{23}=0.25$, as shown in FIG. 6. EQ.s 14, 15, and 16 relate the flow of current to the bus-voltage-phase angle (using a DC load-flow model).

$$f_{13} = \frac{1}{x_{13}}(\theta_1 - \theta_3) \text{ Per-Unit} \qquad \text{EQ. 14}$$

$$f_{32} = \frac{1}{x_{23}}(\theta_3 - \theta_2) \text{ Per-Unit} \qquad \text{EQ. 15}$$

$$f_{12} = \frac{1}{x_{12}}(\theta_1 - \theta_2) \text{ Per-Unit} \qquad \text{EQ. 16}$$

where, $f_{ab}$: is the per-unit power flow from Bus a to Bus b,
$X_{ab}$: is the per-unit reactance of the transmission line between Bus a and Bus b,
$\theta_a$: is the phase angle (in radians) between the voltage at Bus a and the network swing bus.

The monitors 430 and 440 in FIG. 6 give the line flows $f_{13}$ and $f_{32}$ respectively. Setting Bus 3 as the network swing bus ($\theta_3=0$) and solving EQs. 14 and 15 for $\theta_1$ and $\theta_2$ yields $\theta_1=0.02$ radians and $\theta_2=-0.1$ radians. These values can be put into EQ. 16 to determine that the power flow in the unmonitored transmission line, 400, from Bus 1 to Bus 2 is 0.6 per-unit. This method requires knowledge of the power system topology and the line reactances. This information could be obtained from load-flow data publicly available from agencies such as the respective regional reliability council or independent system operator.

Referring again to FIG. 3, information on the relative magnitude and phase angle of current flow in each of the lines 11 and 12 supplying the monitored facility 10 may be relayed by the central computing facility 16 to the end-user location 20, without calculations of the type described above. Net current and power flow to or from the monitored facility 10 may be estimated by assuming each line is operated at the same power factor, and calculating the arithmetic sum of current or power flow into or out of the facility. This is an approximation. Similarly, knowledge of the presence or absence of current flow in a line or into or out of a facility could be determined without calculation by simply detecting the presence or absence of magnetic fields from the monitored lines.

Figure 7:
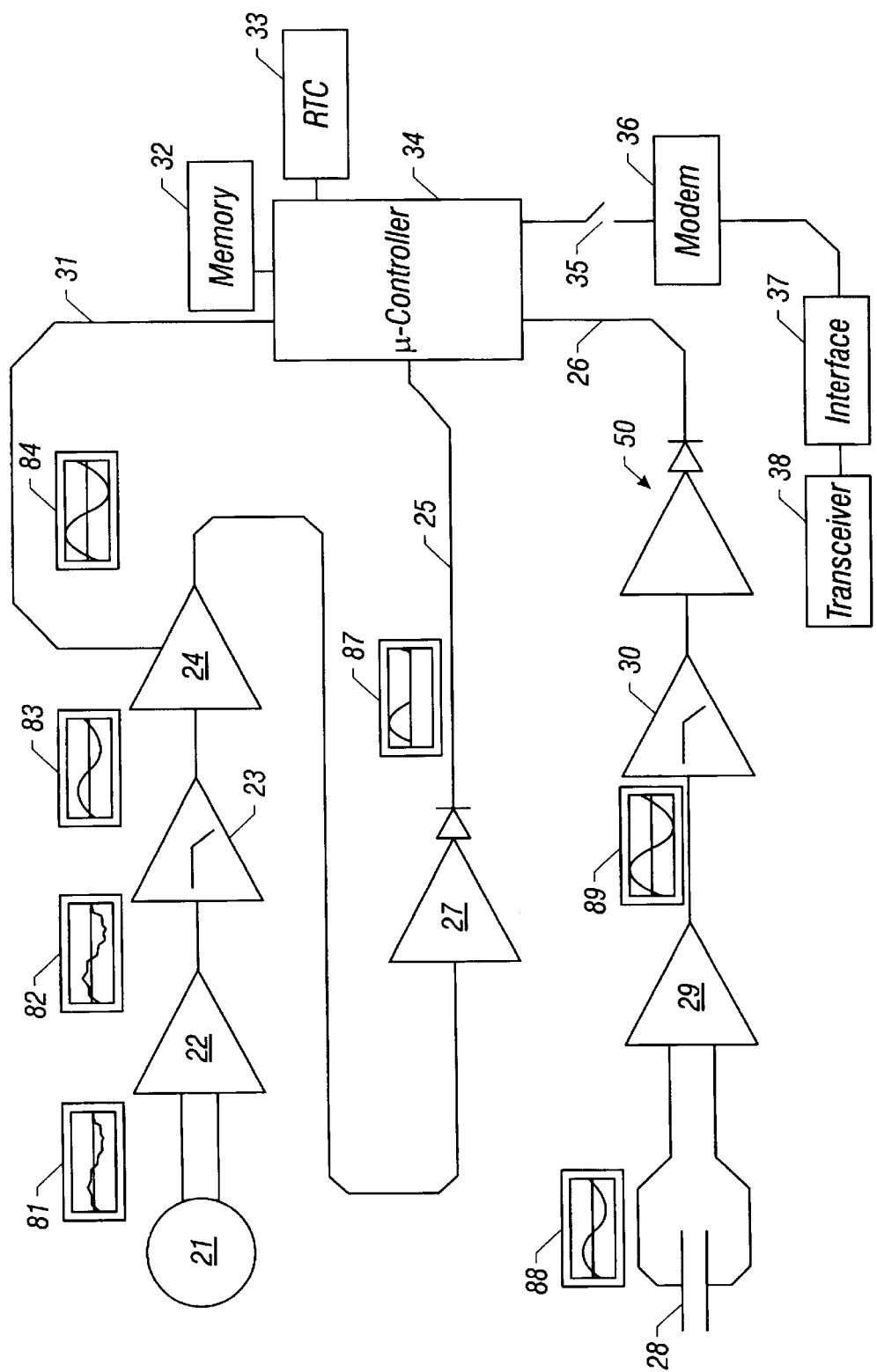
FIG. 7 is a block diagram of an exemplary embodiment of an apparatus according to the present invention.

FIG. 7 is a block diagram of an exemplary embodiment of a monitor according to the present invention. Although shown with only a single magnetic field and electric field sensor, it is to be understood that a monitor according to the present invention may include a plurality of these sensors, in addition to circuitry connected thereto. The monitor comprises a coil probe 21 for transducing the net magnetic field passing through the plane of the probe. Hall effect sensors may be used to transduce magnetic field, though they are more sensitive to the earth's magnetic field than are coil probes. A magneto-optic current transducer might also be used to sample magnetic field. In the case of a coil probe, a voltage in proportion to the magnitude and frequency of current flow in the monitored transmission or distribution line is generated between the two end leads of the coil according to EQ. 17.

$$V_{probe} = -N\pi r^2 \frac{dB}{dt} V, \qquad \text{EQ. 17}$$

where,

N: is the number of turns of wire on the coil,
r: is the radius in meters of the coil probe,
B: is the average magnetic flux density (parallel to the probe axis) passing through the area bounded by the probe coils.

In an exemplary embodiment, this voltage may then be conditioned for analysis by appropriate conditioning circuitry. Specifically, in the embodiment shown in FIG. 7, the voltage from the coil probe 21 is then amplified by an instrumentation amplifier 22 and removed of unwanted high-frequency components by a low-pass operational-amplifier based filter 23 to develop a conditioned voltage. An op-amp based integrator could be used in place of (or in addition to) the low-pass filter to restore a true measure of the current. The signal from the filter is further amplified by an instrumentation amplifier with digitally controlled gain (controlled by a signal from microcontroller 34) 24, and then is one-half wave rectified through the use of an operational amplifier and a diode 27. Rectification is performed to prevent damage to the analog-to-digital (A/D) converters located on the microprocessor. Some A/D converters could accept the negative voltage signals that result each one-half cycle without the risk of damage, and the rectification stage could be eliminated. Likewise, a DC offset could be introduced to allow the voltage from amplifier 24 to swing from peak to peak without going negative. One-half wave rectification is useful, however, to distinguish a positive going pulse from a negative pulse without a DC offset. The output of the diode/operational amplifier pair 27 is fed to microcontroller 34, where an on-board A/D converter samples the signal. Further shown in FIG. 7 is an exemplary signal passing through the circuitry. Specifically, representations 81, 82, 83, 84, and 87 show the exemplary signal at the different circuit stages described above.

In an exemplary embodiment, the microcontroller 34 may be a Motorola MC68HC11 microcontroller. Other suitable microcontrollers might include the Motorola MC68HC12, the Intel 8051 series, the Micromint PIC series, or the BASIC series from Parallax. The principal requirements of the microcontroller are that it sample and record signals and control a communications device to telemeter recorded data to the central computing facility. The microcontroller 34 is connected to the gain controls of the amplifier 24 via a pair of the output ports 31 of the microcontroller 34. Algorithms programmed into the microcontroller attempt to maintain the output voltage of the rectifier 27 between zero and five volts, a level compatible with the operational limits of the on-board analog-digital converter of the microcontroller.

The rectified signal from operational amplifier 27 is connected to an A/D converter (not shown in FIG. 7) within the microcontroller 34. Algorithms programmed into the microcontroller determine a measure of the magnitude of the magnetic field passing through the plane of the coil probe 21 based upon this rectified signal. In an exemplary embodiment of the present invention, the conditioned signal from the magnetic field probe is sampled for a known number of cycles and the average value of non-zero inputs is recorded as a measure of the magnitude of magnetic field intensity. Further processing of the input signal could include digital filtering to remove high frequency components. Alternately, a peak value of field could be recorded as a measure or the root mean square of the voltage signal from 27 could be computed and recorded. The measure of the magnetic field generated by the monitored line may then be stored by the microcontroller 34 in digital memory 32.

In order to determine the phase relationship between conductor voltage and monitored conductor current, and the direction of current flow in the line, an electric field transducer 28 may also be included in the monitoring apparatus. Because electric field is related to the voltages on the conductors comprising the monitored line, and these voltages in steady-state operation vary little from their nominal values, the transduced electric field can provide, in the absence of other electric fields, a fixed reference signal synchronized to power system voltage. This transducer may be a free-body meter, or a ground-reference type meter, as defined in IEEE Standard 644-1994. A synchronized signal could be provided by a direct connection to some element of the power system such as could be accomplished through an opto-electronic link, a transformer, or a wire-to-wire connection to a wall outlet. Any such connection may provide a signal synchronized to power system frequency and would suffice as an input signal for this stage. In the exemplary embodiment, two parallel (to each other and ground), metallic, isolated plates vertically separated are used and the voltage between the plates 28 varies in proportion to the ambient electric field generated by the transmission or distribution line at the point in space occupied by the probe. In the exemplary embodiment, this signal is fed to a non-inverting operational amplifier 29 and then filtered by a low-pass op-amp based filter 30. The gain on the amplifier 29 may be set so as to generate a square wave from the electric field signal in order to aid in the detection of a voltage rise. A transistor based amplifier or buffer may replace amplifier 29 and filtering may not be necessary if the electric field probe does not pick up much high-frequency noise or if the electrical signal at the apparatus input from the probe is not noisy. From the filter, the electric field based signal is rectified by the op-amp-diode combination 50 and is sent to one of the on-board A/D converters (not shown) of the microcontroller 34. Further shown in FIG. 7 are representations 88 and 89, which show an exemplary signal passing through the circuitry discussed above.

The microcontroller samples the analog inputs 25 and 26 representing the conditioned signals from the electric field and the magnetic field probes. Software programmed into the microcontroller waits for a voltage rise on the A/ID converter connected to the signal from the electric field probe 26. A counter is begun that stops counting when a voltage rise is detected on the A/D converter that is connected to the conditioned magnetic field signal 25. This count is a measure of the phase angle difference between the magnetic and electric field probes. In the exemplary embodiment, this process is repeated a set number of times and the average phase angle difference between the signals from the magnetic and the electric field sensors is computed. An additional amplifier (not shown) may be attached in parallel between the rectifier 27 and another A/D converter (not shown) to convert the magnetic field signal to a square wave in order to aid in the detection of a voltage rise. In this case, two A/D converters would be required for the magnetic field signal, one to measure magnitude and the other to measure the time of voltage rise. Alternatively, the signals 25 and 26 may be fed to the input capture ports of the microcontroller 34 and a measure of phase angle determined using the microcontroller's internal clock.

As shown in FIG. 7, a real-time clock (RTC) with alarms 33 may be connected to the microcontroller 34. In an exemplary embodiment, this connection is accomplished via synchronous serial communications lines. In an exemplary embodiment, the microcontroller 34 is connected to a modem 36 via asynchronous serial lines. The modem may then be connected via a commercial cellular telephone interface 37 to a cellular telephone transceiver 38. The microcontroller 34 controls power to the modem and telephone via one of its output ports and an electromechanical relay 35. The microcontroller may also transmit data via a radio-frequency, microwave, land-line telephone, satellite link, or the like. Alternately, the microcontroller 34 may store the computed data until it is downloaded by other means, such as a computer to microcontroller link, or the like. In an exemplary embodiment, the microcontroller 34 may transmit data to the central computing facility every four hours.

The entire system depicted in FIG. 7 may be battery operated and solar recharged. Positive and negative micropower voltage regulators, (not shown), may be used to condition power to the analog circuitry. One pair of positive and negative regulators provides power to circuit elements 22–24, 27, 29, 30, and 50. These regulators are controlled by the microcontroller 34 via a single output port and can be turned on or off by the microcontroller to conserve battery power. A second positive voltage regulator provides continuous power to the microprocessor 34, memory 32, and the real-time clock 33. The apparatus may also be recharged by a wind or water powered generator. Similarly, if electrical service is available at the installation location, the device could be powered from the electric power system.

Algorithms may be programmed into digital memory 32 to control the microprocessor 34 as follows. The microprocessor samples the time from the real-time clock 33 and records the time in digital memory 32. Subsequently, the microcontroller 34 samples the rectified voltage from the amplifier-diode combination 27, determining an average value of the waveform over several cycles. This measure is, likewise, stored in digital memory 32.

The microcontroller 34 then samples the conditioned electric field signal 26. This continues until the microcontroller 34 detects a rising voltage. A counter is started at this point. Subsequently, it begins to sample the conditioned magnetic field signal 25. When a rising voltage is detected, the counter is stopped. This process may be repeated several times and the average of the counter values is recorded in digital memory 32 as a measure of the phase angle difference between electric and magnetic field.

The microprocessor 34 then determines from the set of recorded values whether to power-up the communications equipment 36–38 and communicate the stored data. The microprocessor 34 can choose to communicate its recorded data continuously, or it can be programmed to wait prescribed intervals of time between communications. Additionally, algorithms can be programmed into the microprocessor 34 to detect changes in the recorded values of magnetic field strength or phase angle relationship that result in a data transmission.

The real-time clock 33 also contains a set of programmable alarms. These alarms allow for algorithms that turn off power to the analog circuit elements 22–24, 27, 29, 30, and 50, and place the microcontroller in a minimum-power standby state, thus reducing power drain on the battery power system. The alarms in the real-time clock 33 periodically force the microprocessor 34 from its standby state into full-power operation. In this state, the system engages in the sampling and communication processes described above before returning to the minimum-power standby state. In an exemplary embodiment, the system alternates between minimum-power and full-power once every minutes.

The system detailed in FIG. 7, including the battery power system, is optimally contained in a weather proof structure constructed of a material, such as wood, fiberglass, or plastic, that will not interfere significantly with the ambient magnetic and electric fields generated by the power line undergoing monitoring. The electronic elements illustrated in FIG. 7, with the exception of the sensors 21 and 28, and the telephone transceiver antenna 38, may be further contained in a grounded conductive structure in order to shield these elements from the electromagnetic fields from the power lines. The monitor may be placed above ground, or below ground, provided that the electric field probe 28, is located above ground at a sufficient height to provide an adequately strong signal and eliminate interference from natural elements such as grass or weeds. The electric field probe 28, in an exemplary embodiment is not located near elements that will disturb the electric field in a time-varying fashion. It is also necessary to locate the telephone transceiver antenna 38 at a height that ensures reliable data transmission. The solar panel recharging the battery is best located so as to maximize the use of available sunlight. It is desirable to locate the device away from objects such as trees, buildings, other power lines, or fences that may interfere with the electromagnetic signals from the transmission line.

Figure 1:
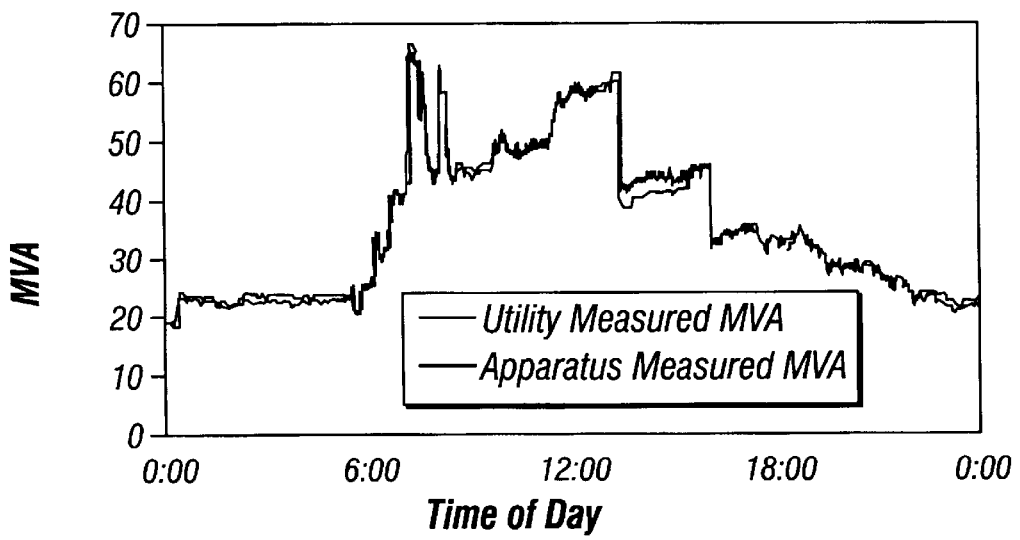
FIG. 1 details plots comparing the complex power flow in a transmission line as determined by an exemplary embodiment of the apparatus according to the present invention and the power flow determined by the operating utility during a twenty-four hour period.
Figure 2:
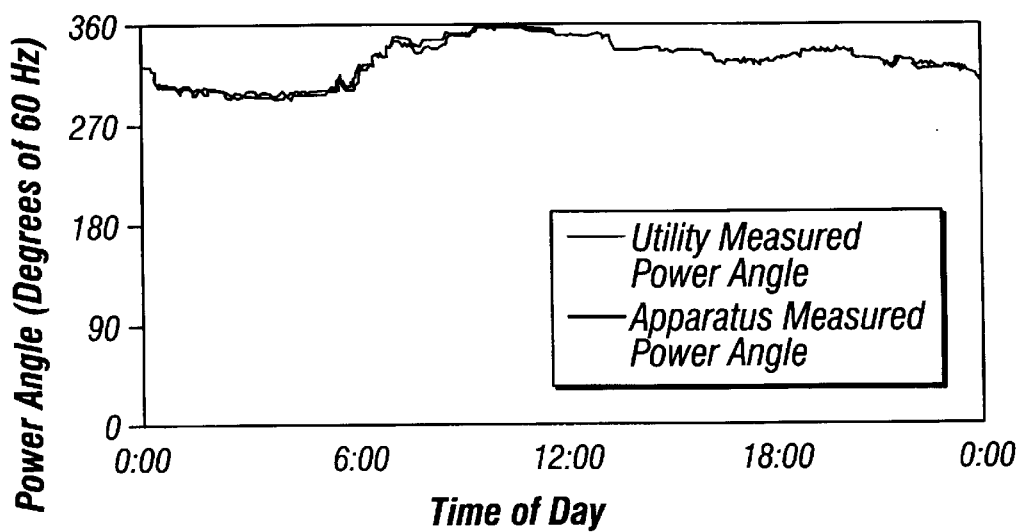
FIG. 2 details a comparison of plots of the power angle between line-to-ground voltage and current in a transmission line during a twenty-four hour period as determined by an exemplary embodiment of the apparatus according to the present invention and by the operating utility.

As of the filing date of this patent application, two apparatuses that function as exemplary embodiments of the present invention have been deployed for a period of over six months in proximity to three transmission lines originating from a substation operated by a municipal utility. FIG. 1 shows the measure of electric power flow over a twenty- four hour period as determined by one of the apparatuses and the central computing facility described herein. Also shown in FIG. 1 is the measure of power flow as recorded by the operating utility using monitors connected directly to the transmission line conductors. FIG. 2 details the power angle, or angle in degrees of power frequency between voltage and current, in each conductor as derived from the monitoring apparatus. Shown also in FIG. 2 is the measure of power angle determined by the operating utility. The transmission line is operated at 138 kV (line-line).

Further modification and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having benefit of this description of the invention.

Attached hereto as Appendices A and B are source codes that are examples of programming used in an exemplary embodiment to practice the present invention. Other programs may be used without departing from the scope of the invention.

REFERENCES

The following references, to the extent that they provide exemplary procedural or other details supplementary to those set forth herein, are specifically incorporated herein by reference.

[1] IEEE Standard Procedures for Measurement of Power Frequency Electric and Magnetic Fields from AC Power Lines, IEEE Std 644-1994, Institute of Electrical and Electronics Engineers, New York, N.Y., 1994.

[2] A. J. Wood, B. F. Woolenberg, *Power Generation, Operation, and Control*, John Wiley and Sons, New York, 1984.

APPENDIX "A"

© 1999, Preston T   aats

PhFind.VBP Program.  MicroSoft Visual Basic 6.0 – for use under 32 bit Windows operating system.

Private Type Complex
 Real As Double
 Imaginary As Double
End Type
Dim Num As Integer
Dim Radius As Double
Dim Phase(6) As Complex, Hfield As Complex
Dim Position(8, 2) As Double
Dim Numpts As Integer
Dim Pht As Double
Dim Bxm(250) As Double, Bym(250) As Double
Dim Ht(250) As Double
Dim P(6) As Complex
Dim D(250) As Double
Dim hlogSSE As Integer 'D(i)            meters
'Bxm(I), Bym(I)     uT
'Cond(x,y)   x = conductor num y =1 means x comp, y=2 y comp meters
'PA,PB,PC - complex = unit phasor in 0, -120, + 120 deg.
'P(x)    unit phasor of conductor x voltage
'Ax(18)  constants for Newton Raphson - fitting magnetic x dir.
'Ay(18)  constants for Newton Raphson - fitting magnetic y dir.
Option Explicit 'Graphical Interface
'Text4(0)        X Position of conductor A Line 1
'Text4(1)        Y Position of conductor A Line 1
'Text4(2)        Current of all line 1phases for creating an input file
'Text4(5)        X Position of conductor B Line 1
'Text4(4)        Y Position of conductor B Line 1
'Text4(6)        X Position of conductor C Line 1
'Text4(7)        Y Position of conductor C Line 1
'Text4(15)       Current of all line 2 phases for creating an input file)
'Option1(1)      Phase A selection for conductor A line 1
'Option1(2)      Phase B selection for conductor A line 1
'Option1(3)      Phase C selection for conductor A line 1
'Option1(5)      Phase A selection for conductor B line 1
'Option1(4)      Phase B selection for conductor B line 1
'Option1(0)      Phase C selection for conductor B line 1
'Option1(6)      Phase A selection for conductor C line 1
'Option1(7)      Phase B selection for conductor C line 1
'Option1(8)      Phase C selection for conductor C line 1
'Option1(9)      Phase A selection for conductor A line 2
'Option1(10)     Phase B selection for conductor A line 2
'Option1(11)     Phase C selection for conductor A line 2
'Option1(14)     Phase A selection for conductor B line 2
'Option1(13)     Phase B selection for conductor B line 2
'Option1(12)     Phase C selection for conductor B line 2
'Option1(15)     Phase A selection for conductor C line 2
'Option1(16)     Phase B selection for conductor C line 2
'Option1(17)     Phase C selection for conductor C line 2
'Command1        Command button – find solution
'Option2(0)      Fit only horizontal field

| | |
|---|---|
| 'Option2(1) | Fit only vertical field |
| 'Option2(2) | Fit both horizontal and vertical field |
| 'Check4 | Allow the phase angle between line currents to vary |
| 'Check5 | Solve for fits for all possible combinations |
| Text5 | Select phasing to be fit (for condition where all are not examined) |
| 'Text6 | Maximum number of iterations to find a solution |
| 'Text7 | Initial guess for line current 1 magnitude |
| 'Text8 | Initial guess for line current 2 magnitude |

```
Private Sub Command1_Click()
Dim hLogFileIn As Integer
Dim I As Integer, J As Integer
Dim PA As Complex, PB As Complex, PC As Complex
Dim X1 As Double, X2 As Double, X3 As Double
Dim hLogFileOut As Integer
Dim Tst1 As Double
Dim PhaseSeq As Integer, Loading As Integer
Dim SSErr As Double
Dim TermSize As Integer
Dim Desc As String * 7

'Routine assumes that input data is formatted as follows
'Height of measurement (Ft), xposition (ft),MagBx (uT),MabBy (uT)
hLogFileIn = FreeFile
Open "c:\AATemp\PHFindIn.txt" For Input As hLogFileIn
Command1.Enabled = False
Command1.Caption = "Evaluating"
I = 0
'Input the distance and magnetic field data.
Do Until EOF(hLogFileIn)
I = I + 1
Input #hLogFileIn, Ht(I), D(I), Bxm(I), Bym(I)
Ht(I) = Ht(I) / 3.2808
D(I) = D(I) / 3.2808
Loop
Close hLogFileIn
Numpts = I
Position(1, 1) = Text4(0).Text / 3.2808
Position(1, 2) = Text4(1).Text / 3.2808
Position(2, 1) = Text4(5).Text / 3.2808
Position(2, 2) = Text4(4).Text / 3.2808
Position(3, 1) = Text4(6).Text / 3.2808
Position(3, 2) = Text4(7).Text / 3.2808
Position(4, 1) = -Text4(0).Text / 3.2808
Position(4, 2) = Text4(1).Text / 3.2808
Position(5, 1) = -Text4(5).Text / 3.2808
Position(5, 2) = Text4(4).Text / 3.2808
Position(6, 1) = -Text4(6).Text / 3.2808
Position(6, 2) = Text4(7).Text / 3.2808
PA = MakeCmplx(1, 0)
PB = MakeCmplx(-0.5, -Sin(2 / 3 * (Atn(1) * 4)))
PC = MakeCmplx(-0.5, Sin(2 / 3 * (Atn(1) * 4)))

'Try each phasing possibility.  Generate a number that describes the
'Fit of the curve.  The best one wins.
```

```
'The first combination

If Check5.Value = 0 Then
 PhaseSeq = Text5.Text
 X1 = Text7.Text
 X2 = Text8.Text
 Call ChPhase(PA, PB, PC, PhaseSeq)
 Call FindI(X1, X2, X3, P(), SSErr)
 Call Outsol(X1, X2, X3, P())
Else
 TermSize = Len(SolutionView.Term.Text)
 SolutionView.Term.SelStart = TermSize
 SolutionView.Term.SelText = "PhaseSeq   Current1   Current2   Angle   SSE  " & vbCrLf
 For PhaseSeq = 1 To 9
  Call ChPhase(PA, PB, PC, PhaseSeq)
  For Loading = 0 To 1
   If Loading = 0 Then
    X1 = Text7.Text
    X2 = Text8.Text
    Select Case PhaseSeq
     Case 1
      Desc = "PP Inph"
     Case 2
      Desc = "NN Inph"
     Case 3
      Desc = "PP +120"
     Case 4
      Desc = "PN +120"
     Case 5
      Desc = "PN -120"
     Case 6
      Desc = "PN Inph"
     Case 7
      Desc = "NN -120"
     Case 8
      Desc = "NN +120"
     Case 9
      Desc = "PP -120"
    End Select
    Command1.Caption = "Solving Phase: +" & PhaseSeq & "(" & Desc & ")"
   Else
    X1 = Text7.Text
    X2 = -Text8.Text
    Command1.Caption = "Solving Phase: -" & PhaseSeq & " (" & Desc & ")"
   End If
   Call FindI(X1, X2, X3, P(), SSErr)
   TermSize = Len(SolutionView.Term.Text)
   SolutionView.Term.SelStart = TermSize
   SolutionView.Term.SelText = "  " & Format(PhaseSeq, "0") & " " & (" & Desc & ")   " & Format(X1,
"##00") & "       " & Format(X2, "##00") & "        " & Format(X3, "###") & "      " &
Format(SSErr, "####0.00#####") & vbCrLf
  Next Loading
 Next PhaseSeq
End If
Command1.Caption = "Compute Phases"
Command1.Enabled = True
```

```
End Sub
Private Sub ChPhase(PA As Complex, PB As Complex, PC As Complex, _
        PhaseSeq As Integer)
Select Case PhaseSeq
Case 1
P(1) = PA
P(2) = PB
P(3) = PC
P(4) = PA
P(5) = PB
P(6) = PC
Case 2
P(1) = PA
P(2) = PC
P(3) = PB
P(4) = PA
P(5) = PC
P(6) = PB
Case 3
P(1) = PA
P(2) = PB
P(3) = PC
P(4) = PB
P(5) = PC
P(6) = PA
Case 4
P(1) = PA
P(2) = PB
P(3) = PC
P(4) = PB
P(5) = PA
P(6) = PC
Case 5
P(1) = PA
P(2) = PB
P(3) = PC
P(4) = PC
P(5) = PB
P(6) = PA
Case 6
P(1) = PA
P(2) = PB
P(3) = PC
P(4) = PA
P(5) = PC
P(6) = PB
Case 7
P(1) = PA
P(2) = PC
P(3) = PB
P(4) = PC
P(5) = PB
P(6) = PA
Case 8
P(1) = PA
P(2) = PC
```

```
        P(3) = PB
        P(4) = PB
        P(5) = PA
        P(6) = PC
    Case 9
        P(1) = PA
        P(2) = PB
        P(3) = PC
        P(4) = PC
        P(5) = PA
        P(6) = PB
    End Select
End Sub
Private Sub Outsol(X1 As Double, X2 As Double, X3 As Double, _
        P() As Complex)

Dim Pdt As Complex, Pht(6) As Complex
Dim Bx As Double, By As Double
Dim hLogOutSol As Integer
Dim J As Integer hLogOutSol = FreeFile
Open "c:\AATemp\PhaseOUT.txt" For Output As hLogOutSol
Print #hLogOutSol, "Y X-pos BxMeas ByMeas BxComp ByComp"
Pdt = MakeCmplx(Cos(X3 * 4 * Atn(1) / 180), _
        Sin(X3 * 4 * Atn(1) / 180))
For J = 1 To 6
    Pht(J) = P(J)
    If (J >= 4) Then Pht(J) = MultCmplx(P(J), Pdt)
Next J
For J = 1 To Numpts
Call FindMagB(Bx, By, D(J), Ht(J), Pht(), X1, X2)
Print #hLogOutSol, Format(Ht(J) * 3.2808, "000.0") & "  ";
Print #hLogOutSol, Format(D(J) * 3.2808, "000.0") & "  ";
Print #hLogOutSol, Format(Bxm(J), "0.000") & "  ";
Print #hLogOutSol, Format(Bym(J), "0.000") & "  ";
Print #hLogOutSol, Format(Bx, "0.000") & "  ";
Print #hLogOutSol, Format(By, "0.000") & "  "
Next J
Close hLogOutSol
End Sub Private Sub FindI(X1 As Double, X2 As Double, X3 As Double, _
        P() As Complex, SSErr As Double)

Dim J As Integer, I As Integer
Dim F(3) As Double, eps As Double
Dim Cntr As Integer
Dim Jac(3, 3) As Double, Delta(3) As Double
Dim Pdt As Complex, Pht(6) As Complex
Dim TermSize As Integer, Ord As Integer eps = 0.01
X3 = 0
Cntr = 0
```

```
SolutionView.Show
If Check4.Value = 1 Then
 Ord = 3
Else
 Ord = 2
End If
Do Until (Cntr > Text6.Text)
 Cntr = Cntr + 1
 'Debug.Print "Trial: ", Cntr
 If Check5.Value = 0 Then
  TermSize = Len(SolutionView.Term.Text)
  SolutionView.Term.SelStart = TermSize
  SolutionView.Term.SelText = "Trial: " & Cntr & vbCrLf
  TermSize = Len(SolutionView.Term.Text)
  SolutionView.Term.SelStart = TermSize
  SolutionView.Term.SelText = "X1: " & X1 & vbCrLf
  TermSize = Len(SolutionView.Term.Text)
  SolutionView.Term.SelStart = TermSize
  SolutionView.Term.SelText = "X2: " & X2 & vbCrLf
  TermSize = Len(SolutionView.Term.Text)
  SolutionView.Term.SelStart = TermSize
  SolutionView.Term.SelText = "X3 " & X3 & vbCrLf
 End If
 Pdt = MakeCmplx(Cos(X3 * 4 * Atn(1) / 180), _
         Sin(X3 * 4 * Atn(1) / 180))
 For J = 1 To 6
 Pht(J) = P(J)
 If (J >= 4) Then Pht(J) = MultCmplx(P(J), Pdt)
 Next J Call MkJac(X1, X2, X3, Jac(), P())
 Call Invert(Ord, Jac())
 F(1) = F1(X1, X2, X3, P())
 F(2) = F2(X1, X2, X3, P())
 F(3) = F3(X1, X2, X3, P())
 Delta(1) = 0
 Delta(2) = 0
 Delta(3) = 0
 For J = 1 To Ord
  For I = 1 To Ord
   Delta(J) = Delta(J) - Jac(J, I) * F(I)
  Next I
  If (Delta(J) > 100) Then Delta(J) = 100
  If (Delta(J) < -100) Then Delta(J) = -100
 Next J
 If Check5.Value = 0 Then
  TermSize = Len(SolutionView.Term.Text)
  SolutionView.Term.SelStart = TermSize
  SolutionView.Term.SelText = "dX1: " & Delta(1) & vbCrLf
  TermSize = Len(SolutionView.Term.Text)
  SolutionView.Term.SelStart = TermSize
  SolutionView.Term.SelText = "dX2: " & Delta(2) & vbCrLf
  TermSize = Len(SolutionView.Term.Text)
  SolutionView.Term.SelStart = TermSize
  SolutionView.Term.SelText = "dX3 " & Delta(3) & vbCrLf
  TermSize = Len(SolutionView.Term.Text)
```

```
SolutionView.Term.SelStart = TermSize
SSErr = SSE(X1, X2, Pht())
SolutionView.Term.SelText = "SSE: " & SSErr & vbCrLf
TermSize = Len(SolutionView.Term.Text)
SolutionView.Term.SelStart = TermSize
SolutionView.Term.SelText = " " & vbCrLf
End If
X1 = X1 + Delta(1)
X2 = X2 + Delta(2)
X3 = X3 + Delta(3)
' If (X3 > 90) Then X3 = 90
' If (X3 < -90) Then X3 = -90
If ((Abs(Delta(1)) < eps) And _
    (Abs(Delta(2)) < eps) And (Abs(Delta(3)) < eps)) Then
GoTo EFR
End If
Loop
EFR:  SSErr = SSE(X1, X2, Pht())
End Sub
Private Sub MkJac(X1 As Double, X2 As Double, X3 As Double, _
        Jac() As Double, P() As Complex)

Dim Fbase As Double
Dim Dx As Double

Dx = 3
Fbase = F1(X1, X2, X3, P())
Jac(1, 1) = (F1(X1 + Dx, X2, X3, P()) - Fbase) / Dx
Jac(1, 2) = (F1(X1, X2 + Dx, X3, P()) - Fbase) / Dx
Jac(1, 3) = (F1(X1, X2, X3 + Dx, P()) - Fbase) / Dx
Fbase = F2(X1, X2, X3, P())
Jac(2, 1) = (F2(X1 + Dx, X2, X3, P()) - Fbase) / Dx
Jac(2, 2) = (F2(X1, X2 + Dx, X3, P()) - Fbase) / Dx
Jac(2, 3) = (F2(X1, X2, X3 + Dx, P()) - Fbase) / Dx
Fbase = F3(X1, X2, X3, P())
Jac(3, 1) = (F3(X1 + Dx, X2, X3, P()) - Fbase) / Dx
Jac(3, 2) = (F3(X1, X2 + Dx, X3, P()) - Fbase) / Dx
Jac(3, 3) = (F3(X1, X2, X3 + Dx, P()) - Fbase) / Dx
'Debug.Print Jac(1, 1), " ", Jac(1, 2), " ", Jac(1, 3)
'Debug.Print Jac(2, 1), " ", Jac(2, 2), " ", Jac(2, 3)
'Debug.Print Jac(3, 1), " ", Jac(3, 2), " ", Jac(3, 3)
End Sub
Private Function F1(X1 As Double, X2 As Double, X3 As Double, _
        P() As Complex)

Dim J As Integer, Ph(6) As Complex
Dim SSE1 As Double
Dim Pd As Complex
Dim dX1 As Double dX1 = 5

'This function computes the change in SSE wrt change in X1
'Modify the phase displacement to account for the shift in X3
Pd = MakeCmplx(Cos(X3 * 4 * Atn(1) / 180), _
```

```
            Sin(X3 * 4 * Atn(1) / 180))
For J = 1 To 6
 Ph(J) = P(J)
 If (J >= 4) Then Ph(J) = MultCmplx(P(J), Pd)
Next J
'Compute the SSE with the original value of X1
SSE1 = SSE(X1 + dX1, X2, Ph())
' Debug.Print "F1, SSE1 ", SSE1, "x1,x2,x3"
'Compute the SSE with the changed value of X1
SSE1 = SSE1 - SSE(X1, X2, Ph())
' Debug.Print "F1, SSE2 ", SSE1
' Debug.Print "F1, ", SSE1 / dX1
'Determine the derivative
F1 = SSE1 / dX1

End Function
Private Function F2(X1 As Double, X2 As Double, _
           X3 As Double, P() As Complex)

Dim J As Integer, Ph(6) As Complex
Dim SSE1 As Double
Dim Pd As Complex
Dim dX2 As Double dX2 = 5

'This function computes the change in SSE wrt change in X2
'Modify the phase displacement to account for the shift in X3
Pd = MakeCmplx(Cos(X3 * 4 * Atn(1) / 180), _
         Sin(X3 * 4 * Atn(1) / 180))
For J = 1 To 6
 Ph(J) = P(J)
 If (J >= 4) Then Ph(J) = MultCmplx(P(J), Pd)
Next J
'Compute the SSE with the original value of X2
SSE1 = SSE(X1, X2 + dX2, Ph())
'Compute the SSE with the changed value of X2
SSE1 = SSE1 - SSE(X1, X2, Ph())
'Determine the derivative
F2 = SSE1 / dX2
End Function
Private Function F3(X1 As Double, X2 As Double, _
           X3 As Double, P() As Complex)

Dim J As Integer, Ph(6) As Complex
Dim SSE1 As Double
Dim Pd As Complex
Dim dX3 As Double dX3 = 3
'This function computes the change in SSE wrt change in X3
'Modify the phase displacement to account for the shift in X3
Pd = MakeCmplx(Cos(X3 * 4 * Atn(1) / 180), _
         Sin(X3 * 4 * Atn(1) / 180))
For J = 1 To 6
 Ph(J) = P(J)
```

```
If (J >= 4) Then Ph(J) = MultCmplx(P(J), Pd)
Next J
'Compute the SSE with the original value of X3
SSE1 = SSE(X1, X2, Ph())
'Compute the SSE with the changed value of X3
Pd = MakeCmplx(Cos((X3 + dX3) * 4 * Atn(1) / 180), _
      Sin((X3 + dX3) * 4 * Atn(1) / 180))
For J = 1 To 6
 Ph(J) = P(J)
 If (J >= 4) Then Ph(J) = MultCmplx(P(J), Pd)
Next J
SSE1 = -SSE1 + SSE(X1, X2, Ph())
'Determine the derivative
F3 = SSE1 / dX3
End Function
Private Function SSE(X1 As Double, X2 As Double, Ph() As Complex)

'This function determines the total sum square error (SSE)
'between the magnetic field curves (X and Y) generated by
'the current in line1 X1, current in line 2 X2, and phasing
'of the lines Ph() and the array of measured values as read
'from some file.

Dim J As Integer
Dim Bx As Double, By As Double
Dim TSSE As Double

' hlogSSE = FreeFile
' Open "c:\AATemp\SSEOut.txt" For Output As hlogSSE

'Each point in the array of measured values will be compared against
'the computed points.
TSSE = 0
For J = 1 To Numpts
 Call FindMagB(Bx, By, D(J), Ht(J), Ph(), X1, X2)
' Print #hlogSSE, Ht(J), D(J), BX, BY, Bxm(J), Bym(J)
 If Option2(0).Value = 1 Then
  TSSE = TSSE + (Bxm(J) - Bx) ^ 2
  ElseIf Option2(1).Value = 1 Then TSSE = TSSE + (Bym(J) - By) ^ 2
  Else
   TSSE = TSSE + (Bxm(J) - Bx) ^ 2 + (Bym(J) - By) ^ 2
  End If
Next J
' Print #hlogSSE, "TSSE: ", TSSE
SSE = TSSE
' Close #hlogSSE
End Function Private Sub Command2_Click()
Dim BfieldX As Double, BfieldY As Double
Dim hLogFile As Integer, D As Double, Dm As Double
Dim C1 As Double, C2 As Double Command2.Enabled = False
Command2.Caption = "Evaluating"
```

```
hLogFile = FreeFile
Open "c:\AATemp\PHFindIn.txt" For Output As hLogFile
Call InputData
C1 = Text4(2).Text
C2 = Text4(15).Text
For D = Text4(12).Text To Text4(13).Text Step Text4(14).Text
 Dm = D / 3.2808
 Call FindMagB(BfieldX, BfieldY, Dm, Pht, Phase(), C1, C2)
 Call OutInputdata(hLogFile, D, BfieldX, BfieldY)
Next D
Command2.Enabled = True
Command2.Caption = "Make Input File"
Close hLogFile
Text2.Visible = True
Text2.Text = "Input file - C:\AATemp\PHFindIn.txt"
End Sub
Private Sub OutInputdata(hLogFile As Integer, D As Double, _
         BfieldX As Double, BfieldY As Double)

If Check3.Value = 1 Then
'Include routine here to add 15% normal error to measurements
End If
Print #hLogFile, Format(Pht * 3.2808, "000.0") & "   ";
Print #hLogFile, Format(D, "000.0") & "   ";
Print #hLogFile, Format(BfieldX, "0.000") & "   ";
Print #hLogFile, Format(BfieldY, "0.000") & "   "

End Sub

'***************SOLVE FOR B FIELD************************
Private Sub FindMagB(Bx As Double, By As Double, _
         Xp As Double, Yp As Double, Ph() As Complex, _
         C1 As Double, C2 As Double)
'Returns BfieldX and BfieldY in uT - magnitudes only Dim I, J As Integer
Dim DumCmplx As Complex
Dim Dx(8) As Double, Dy(8) As Double, Rip As Double
Dim HfieldX As Complex, HfieldY As Complex
'****This subroutine returns the Bfield at a point in space
'    (Xp,Yp).  Values are returned in units of Tesla 'Compute the Current/Magnetic info
'Step 1: Compute the Dx matrix - Dx(i)=(yi-yp)/Rip^2
'        and the Dy matrix -    Dy(i)=(Xp-Xi)/Rip^2
For I = 1 To 6
 Rip = (Position(I, 2) - Yp) ^ 2 + (Position(I, 1) - Xp) ^ 2
 Dy(I) = (Xp - Position(I, 1)) / Rip
 Dx(I) = (Position(I, 2) - Yp) / Rip
Next I
'Step2 Multiply [D] by [I]
HfieldX.Real = 0
HfieldX.Imaginary = 0
HfieldY.Real = 0
HfieldY.Imaginary = 0
```

46

```
For I = 1 To 3
 HfieldX = AddCmplx(HfieldX, ScalarMult(Dx(I) * C1, Ph(I)))
 HfieldY = AddCmplx(HfieldY, ScalarMult(Dy(I) * C1, Ph(I)))
 HfieldX = AddCmplx(HfieldX, ScalarMult(Dx(I + 3) * C2, Ph(I + 3)))
 HfieldY = AddCmplx(HfieldY, ScalarMult(Dy(I + 3) * C2, Ph(I + 3)))
Next I
Bx = 0.2 * Mag(HfieldX)
By = 0.2 * Mag(HfieldY)
FinB: End Sub Private Sub Check1_Click()
'Enter the components of the EPRI vertical tower
If Check1.Value = 1 Then
 Check2.Value = 0
 Text4(0).Text = 15
 Text4(1).Text = 41
 Text4(5).Text = 17
 Text4(4).Text = 62
 Text4(6).Text = 15
 Text4(7).Text = 83
End If
End Sub Private Sub Check2_Click()
'Enter the components of the EPRI horizontal tower
If Check2.Value = 1 Then
 Check1.Value = 0
 Text4(0).Text = 23
 Text4(1).Text = 41
 Text4(5).Text = 53
 Text4(4).Text = 41
 Text4(6).Text = 38
 Text4(7).Text = 71
End If
End Sub Private Sub Form_Load()
 Text7.Text = 200
 Text8.Text = 200
 Check4.Value = 1
 Text6.Text = 10
 Frame5.Enabled = True
 Frame6(0).Enabled = True
 Frame6(1).Enabled = True
 Frame6(2).Enabled = True
 Option1(9).Enabled = True
 Option1(10).Enabled = True
 Option1(11).Enabled = True
 Option1(12).Enabled = True
 Option1(13).Enabled = True
 Option1(14).Enabled = True
 Option1(15).Enabled = True
 Option1(16).Enabled = True
 Option1(17).Enabled = True
 Text4(15).Enabled = True
 Text4(15).Text = " "
```

```
Label2(0).Enabled = True
Text4(0).Text = 13.5
Text4(1).Text = 35
Text4(2).Text = 100
Text4(15).Text = 100
Text4(5).Text = 16
Text4(4).Text = 50.5
Text4(6).Text = 13.5
Text4(7).Text = 66
Option2(2).Value = 1
Option1(1).Value = 1
Option1(4).Value = 1
Option1(8).Value = 1
Option1(9).Value = 1
Option1(13).Value = 1
Option1(17).Value = 1
Text4(12).Text = -100
Text4(13).Text = 100
Text4(14).Text = 1
Text4(9).Text = 3
Text1.Visible = False
Text3.Text = 0

End Sub

'******************INPUT DATA *********************************************

Private Sub InputData()
Dim PCmplx1 As Complex, PCmplx2 As Complex
Dim I As Integer
Dim Pd As Complex Num = 0
For I = 1 To 6
 Phase(I) = MakeCmplx(0, 0)
 Position(I, 1) = 0
 Position(I, 2) = 0
Next I 'Input all the position and phase information from the user
If Option1(1).Value Or Option1(2).Value Or Option1(3).Value Then
 If Option1(1).Value Then
  Phase(1) = MakeCmplx(1, 0)
 ElseIf Option1(2).Value Then
  Phase(1) = MakeCmplx(-0.5, -0.8666)
 Else
  Phase(1) = MakeCmplx(-0.5, 0.86666)
 End If
End If
If Option1(5).Value Or Option1(4).Value Or Option1(0).Value Then
 If Option1(5).Value Then
  Phase(2) = MakeCmplx(1, 0)
 ElseIf Option1(4).Value Then
  Phase(2) = MakeCmplx(-0.5, -0.8666)
 Else
```

```
  Phase(2) = MakeCmplx(-0.5, 0.86666)
End If
End If
If Option1(6).Value Or Option1(7).Value Or Option1(8).Value Then
If Option1(6).Value Then
Phase(3) = MakeCmplx(1, 0)
ElseIf Option1(7).Value Then
Phase(3) = MakeCmplx(-0.5, -0.8666)
Else
Phase(3) = MakeCmplx(-0.5, 0.86666)
End If
End If
Position(1, 1) = Text4(0).Text / 3.2808     'from feet to meters
Position(1, 2) = Text4(1).Text / 3.2808     'from feet to meters
Position(2, 1) = Text4(5).Text / 3.2808     'from feet to meters
Position(2, 2) = Text4(4).Text / 3.2808     'from feet to meters
Position(3, 1) = Text4(6).Text / 3.2808     'from feet to meters
Position(3, 2) = Text4(7).Text / 3.2808     'from feet to meters Pd = MakeCmplx(Cos(Text3.Text * 4 * Atn(1) / 180), _
        Sin(Text3.Text * 4 * Atn(1) / 180))

If Option1(9).Value Or Option1(10).Value Or Option1(11).Value Then
  If Option1(9).Value Then
   Phase(4) = MakeCmplx(1, 0)
  ElseIf Option1(10).Value Then
   Phase(4) = MakeCmplx(-0.5, -0.8666)
  Else
   Phase(4) = MakeCmplx(-0.5, 0.86666)
  End If
End If
If Option1(14).Value Or Option1(13).Value Or Option1(12).Value Then
 If Option1(14).Value Then
  Phase(5) = MakeCmplx(1, 0)
 ElseIf Option1(13).Value Then
  Phase(5) = MakeCmplx(-0.5, -0.8666)
 Else
  Phase(5) = MakeCmplx(-0.5, 0.86666)
 End If
End If
If Option1(15).Value Or Option1(16).Value Or Option1(17).Value Then
 If Option1(15).Value Then
  Phase(6) = MakeCmplx(1, 0)
 ElseIf Option1(16).Value Then
  Phase(6) = MakeCmplx(-0.5, -0.8666)
 Else
  Phase(6) = MakeCmplx(-0.5, 0.86666)
 End If
End If
Phase(4) = MultCmplx(Phase(4), Pd)
Phase(5) = MultCmplx(Phase(5), Pd)
Phase(6) = MultCmplx(Phase(6), Pd)
Position(4, 1) = -Position(1, 1)
Position(4, 2) = Position(1, 2)
Position(5, 1) = -Position(2, 1)
Position(5, 2) = Position(2, 2)
```

```
Position(6, 1) = -Position(3, 1)
Position(6, 2) = Position(3, 2)
Num = 6

Pht = Text4(9).Text / 3.2808
End Sub

'****************SUPPORTING ROUTINES
'**************************************************

'*******************DISTANCE COMPUTER******************
Private Function Dist(X1 As Double, y1 As Double, X2 As Double, y2 As Double) As Double
Dist = (X1 - X2) ^ 2 + (y1 - y2) ^ 2
Dist = Sqr(Dist)
End Function '*****************COMPLEX FUNCTIONS****************
Private Function AddCmplx(Cmplx1 As Complex, Cmplx2 As Complex) As Complex
AddCmplx.Real = Cmplx1.Real + Cmplx2.Real
AddCmplx.Imaginary = Cmplx1.Imaginary + Cmplx2.Imaginary
End Function
Private Function ScalarMult(C1 As Double, Cmplx As Complex) As Complex
ScalarMult.Real = Cmplx.Real * C1
ScalarMult.Imaginary = Cmplx.Imaginary * C1
End Function
Private Function Mag(Cmplx As Complex) As Double
 Mag = Sqr(Cmplx.Real ^ 2 + Cmplx.Imaginary ^ 2)
End Function
Private Function Angle(Cmplx As Complex) As Double
'Returns the value of the angle of a phasor in radians between +/- pi
 If Cmplx.Real = 0 Then
   If Cmplx.Imaginary < 0 Then
    Angle = -3.14159265359 / 2
   End If
   If Cmplx.Imaginary > 0 Then
    Angle = 3.14159265359 / 2
   End If
   If Cmplx.Imaginary = 0 Then
    Angle = 0
   End If
 End If
 If Cmplx.Real <> 0 Then
  Angle = Atn(Cmplx.Imaginary / Cmplx.Real)
 End If
 If (Cmplx.Real < 0) And (Cmplx.Imaginary < 0) Then
  Angle = Angle + 3.14159265359
 End If
 If (Cmplx.Real < 0) And (Cmplx.Imaginary > 0) Then
  Angle = Angle - 3.14159265359
 End If
End Function
Private Function MultCmplx(Cmplx1 As Complex, Cmplx2 As Complex) As Complex
Dim Dummy As Complex
Dummy.Real = Cmplx1.Real * Cmplx2.Real - Cmplx1.Imaginary * Cmplx2.Imaginary
Dummy.Imaginary = Cmplx1.Imaginary * Cmplx2.Real + Cmplx1.Real * Cmplx2.Imaginary
```

```
  MultCmplx = Dummy
End Function
Private Function MakeCmplx(D1 As Double, D2 As Double) As Complex
  MakeCmplx.Real = D1
  MakeCmplx.Imaginary = D2
End Function
Private Function DivCmplx(Cmplx1 As Complex, Cmplx2 As Complex) As Complex
Dim Dummy As Complex
  Dummy.Real = Cmplx1.Real * Cmplx2.Real + Cmplx1.Imaginary * Cmplx2.Imaginary
  Dummy.Imaginary = Cmplx1.Imaginary * Cmplx2.Real - Cmplx1.Real * Cmplx2.Imaginary
  Dummy.Real = Dummy.Real / (Cmplx2.Real ^ 2 + Cmplx2.Imaginary ^ 2)
  Dummy.Imaginary = Dummy.Imaginary / (Cmplx2.Real ^ 2 + Cmplx2.Imaginary ^ 2)
  DivCmplx = Dummy
End Function '*************INVERTING ROUTING******************
Private Sub Invert(Num As Integer, Mat() As Double)
Dim Pivot As Double
Dim K, I, J As Integer
For K = 1 To Num
   Pivot = -1# / Mat(K, K)
   For I = 1 To Num
   For J = 1 To Num
     If ((I = K) Or (J = K)) Then GoTo 50
     Mat(I, J) = Mat(I, J) - Mat(K, J) * Mat(I, K) / Mat(K, K)
50:  Next J
   Next I
   For I = 1 To Num
   For J = 1 To Num
     If ((I = K) And (J = K)) Then GoTo 51
     If ((I = K) Or (J = K)) Then Mat(I, J) = Mat(I, J) * Pivot
51:  Next J
   Next I
   Mat(K, K) = Pivot
Next K
   For I = 1 To Num
   For J = 1 To Num
     Mat(I, J) = -Mat(I, J)
   Next J
   Next I
End Sub
```

APPENDIX "B"

© 1999, Preston T    aats

EBCalculator.VBP Program. MicroSoft Visual Basic 6.0 – for use under 32 bit Windows operating system.

```
Private Type Complex
 Real As Double
 Imaginary As Double
End Type
Dim Num As Integer
Dim Radius As Double
Dim Phase(8) As Complex, Hfield As Complex, Py As Double
Dim Phase1(8) As Complex, Q(8) As Complex
Dim Position(8, 2) As Double
Option Explicit
Private Sub Command1_Click()
Dim BfieldX As Complex, BfieldY As Complex
Dim EfieldX As Complex, EfieldY As Complex
Dim hLogFile As Integer, D As Double, Dm As Double
Dim Theta As Double 'Efieldx is the component of electric field that is horizontal
'Efieldy is the component of electric field that is vertical
'Radius is assumed to be 1 inch
'Graphical Interface
    'Text4(0)       X Position of conductor A Line 1
    'Text4(1)       Y Position of conductor A Line 1
    'Text4(2)       Current of conductor A Line 1
    'Text4(5)       X Position of conductor B Line 1
    'Text4(4)       Y Position of conductor B Line 1
    'Text4(3)       Current of conductor B Line 1
    'Text4(6)       X Position of conductor C Line 1
    'Text4(7)       Y Position of conductor C Line 1
    'Text4(8)       Current of conductor C Line 1
    'Text4(15)      Current of conductor A Line 2
    'Text4(16)      Current of conductor B Line 2
    'Text4(17)      Current of conductor C Line 2
    'Text4(11)      X Position of ground wire
    'Text4(10)      Y position of ground wire
    'Text2          Line voltage (kV)
    'Text3          Degrees that Circuit 2 lags Circuit 1
    'Check3         One or two circuits (checked = 2)
    'Text4(12)      Horizontal distance from (0,0) to begin solution - Begin
    'Text4(13)      Horizontal distance from (0,0) to begin solution - End
    'Text4(14)      Distance between solution calculations
    'Text4(9)       Height above vertical = 0 for solution
    'Command1       Command button to compute solution
    'Option1(1)     Phase A selection for conductor A line 1
    'Option1(2)     Phase B selection for conductor A line 1
    'Option1(3)     Phase C selection for conductor A line 1
    'Option1(5)     Phase A selection for conductor B line 1
    'Option1(4)     Phase B selection for conductor B line 1
    'Option1(0)     Phase C selection for conductor B line 1
    'Option1(6)     Phase A selection for conductor C line 1
    'Option1(7)     Phase B selection for conductor C line 1
    'Option1(8)     Phase C selection for conductor C line 1
    'Option1(9)     Phase A selection for conductor A line 2
```

```
'Option1(10)    Phase B selection for conductor A line 2
'Option1(11)    Phase C selection for conductor A line 2
'Option1(14)    Phase A selection for conductor B line 2
'Option1(13)    Phase B selection for conductor B line 2
'Option1(12)    Phase C selection for conductor B line 2
'Option1(15)    Phase A selection for conductor C line 2
'Option1(16)    Phase B selection for conductor C line 2
'Option1(17)    Phase C selection for conductor C line 2
```

```
Command1.Enabled = False
Command1.Caption = "Evaluating"
Radius = 1 / 12 / 3.2808
hLogFile = FreeFile
Open "c:\AATemp\HEOut.txt" For Output As hLogFile
Print #hLogFile, "Xpos    Ex    ExTheta    Ey    EyTheta    Bx    BxTheta    By    ByTheta"
Call InputData
Call FindQ        'Determine the line charges
For D = Text4(12).Text To Text4(13).Text Step Text4(14).Text
  Dm = D / 3.2808
  Call FindMagB(BfieldX, BfieldY, Dm, Py)
  Call FindE(EfieldX, EfieldY, Dm, Py)
  Call Outdata(hLogFile, D, EfieldX, EfieldY, BfieldX, BfieldY)
Next D
Command1.Enabled = True
Command1.Caption = "Compute"
Close hLogFile
Text1.Visible = True
End Sub
Private Sub Outdata(hLogFile As Integer, D As Double, EfieldX As Complex, EfieldY As Complex, _
          BfieldX As Complex, BfieldY As Complex)
Dim Theta As Double Print #hLogFile, Format(D, "000.0") & "  ";
Print #hLogFile, Format(Mag(EfieldX), "000.00") & "  ";
Theta = Angle(EfieldX) * 180 / 3.1415926
If Theta < -180 Then Theta = Theta + 360
Print #hLogFile, Format(Theta, "000.0") & "  ";
Print #hLogFile, Format(Mag(EfieldY), "000.00") & "  ";
Theta = Angle(EfieldY) * 180 / 3.1415926
If Theta < -180 Then Theta = Theta + 360
Print #hLogFile, Format(Theta, "000.0") & "  ";
Print #hLogFile, Format(Mag(BfieldX), "0.000") & "  ";
Theta = Angle(BfieldX) * 180 / 3.1415926
```

```
If Theta < -180 Then Theta = Theta + 360
Print #hLogFile, Format(Theta, "000.0") & "  ";
Print #hLogFile, Format(Mag(BfieldY), "0.000") & "  ";
Theta = Angle(BfieldY) * 180 / 3.1415926
If Theta < -180 Then Theta = Theta + 360
Print #hLogFile, Format(Theta, "000.0") & "  "
End Sub '***************SOLVE FOR LINE CHARGES Q
'************************************************
Private Sub FindQ()
Dim I As Integer, J As Integer
Dim P(8, 8) As Double 'Find the Line charges on the conductors.  Store in Q (NumxNum)
'Step 1: Make the [p] matrix
 For I = 1 To Num
  For J = 1 To Num
   If I = J Then
   P(I, J) = Log(2 * Position(J, 2) / Radius)
   Else
   P(I, J) = Log(Dist(Position(I, 1), Position(I, 2), Position(J, 1), -Position(J, 2)) _
    / Dist(Position(I, 1), Position(I, 2), Position(J, 1), Position(J, 2)))
   End If
  Next J
 Next I
'Step 2: Invert the p matrix to make the q matrix
Call Invert(Num, P())

'Step 3: Multiply by the conductor voltages to get [q]
For I = 1 To Num
 Q(I).Real = 0
 Q(I).Imaginary = 0
Next I
For I = 1 To Num
 For J = 1 To Num
  Q(I) = AddCmplx(Q(I), ScalarMult(P(I, J), Phase(J)))
 Next J
Next I End Sub
'****************SOLVE FOR E
FIELD******************************************************
Private Sub FindE(EfieldX As Complex, EfieldY As Complex, Xp As Double, Yp As Double)
'Returns EfieldX and EfieldY in kV/m
Dim I, J As Integer
Dim DumCmplx As Complex
Dim Dx(8) As Double, Dy(8) As Double, Ri As Double, Rc As Double
Dim DfieldX As Complex, DfieldY As Complex
'****This subroutine returns the Efield at a point in space
'    (Xp,Yp).  Ex=q/2pie0*( (xp-xc)/distanceptoc - (xp-xc)/distanceptoci )
'           Ey=q/2pie0*( (yp-yc)/distanceptoc - (yp+yc)/distanceptoci )

'Compute the charge/efield info
```

```
'Step 1:
For I = 1 To Num
 If Position(I, 2) = Yp And Position(I, 1) = Xp Then
  EfieldX.Real = 100        'Can't compute the E field at the conductor
  EfieldY.Real = 100
  EfieldX.Imaginary = 0
  EfieldY.Imaginary = 0
  GoTo FinE
 End If
 Rc = (Position(I, 2) - Yp) ^ 2 + (Position(I, 1) - Xp) ^ 2
 Ri = (Position(I, 2) + Yp) ^ 2 + (Position(I, 1) - Xp) ^ 2
 Dx(I) = (Xp - Position(I, 1)) * (1 / Rc - 1 / Ri)
 Dy(I) = (Yp - Position(I, 2)) / Rc - (Position(I, 2) + Yp) / Ri
Next I
'Step2 Multiply by [Q]
DfieldX.Real = 0
DfieldX.Imaginary = 0
DfieldY.Real = 0
DfieldY.Imaginary = 0
For I = 1 To Num
 DfieldX = AddCmplx(DfieldX, ScalarMult(Dx(I), Q(I)))
 DfieldY = AddCmplx(DfieldY, ScalarMult(Dy(I), Q(I)))
Next I
EfieldX = DfieldX
EfieldY = DfieldY
' EfieldX = ScalarMult(1 / (18 * 0.000000001), DfieldX) '(kV/M)
' EfieldY = ScalarMult(1 / (18 * 0.000000001), DfieldY)
FinE: End Sub '**************SOLVE FOR B FIELD***********************
Private Sub FindMagB(BfieldX As Complex, BfieldY As Complex, Xp As Double, Yp As Double)
'Returns BfieldX and BfieldY in uT
Dim I, J As Integer
Dim DumCmplx As Complex
Dim Dx(8) As Double, Dy(8) As Double, Rip As Double
Dim HfieldX As Complex, HfieldY As Complex
'****This subroutine returns the Bfield at a point in space
'    (Xp,Yp). Values are returned in units of Tesla 'Compute the Current/Magnetic info
'Step 1: Compute the Dx matrix - Dx(i)=(yi-yp)/Rip^2
'        and the Dy matrix -    Dy(i)=(Xp-Xi)/Rip^2
If Position(I, 2) = Yp And Position(I, 1) = Xp Then
  BfieldX.Real = 100        'Can't compute the B field at the conductor
  BfieldY.Real = 100
  BfieldX.Imaginary = 0
  BfieldY.Imaginary = 0
  GoTo FinB
End If
For I = 1 To Num
 If Position(I, 2) = Yp And Position(I, 1) = Xp Then
  BfieldX.Real = 1000       'Can't compute the B field at the conductor
  BfieldY.Real = 1000
  BfieldX.Imaginary = 0
  BfieldY.Imaginary = 0
```

```
  GoTo FinB
  End If
  Rip = (Position(I, 2) - Yp) ^ 2 + (Position(I, 1) - Xp) ^ 2
  Dy(I) = (Xp - Position(I, 1)) / Rip
  Dx(I) = (Position(I, 2) - Yp) / Rip
  Next I
  'Step2 Multiply [D] by [I]
  HfieldX.Real = 0
  HfieldX.Imaginary = 0
  HfieldY.Real = 0
  HfieldY.Imaginary = 0
  For I = 1 To Num
  HfieldX = AddCmplx(HfieldX, ScalarMult(Dx(I), PhaseI(I)))
  HfieldY = AddCmplx(HfieldY, ScalarMult(Dy(I), PhaseI(I)))
  Next I
  BfieldX = ScalarMult(0.2, HfieldX)
  BfieldY = ScalarMult(0.2, HfieldY)
FinB: End Sub Private Sub Check1_Click()
'Enter the components of the EPRI vertical tower
If Check1.Value = 1 Then
  Check2.Value = 0
  Text4(0).Text = 15
  Text4(1).Text = 41
  Text4(2).Text = 100
  Text4(5).Text = 17
  Text4(4).Text = 62
  Text4(3).Text = 100
  Text4(6).Text = 15
  Text4(7).Text = 83
  Text4(8).Text = 100
  Option1(1).Value = 1
  Option1(4).Value = 1
  Option1(8).Value = 1
  Option1(9).Value = 1
  Option1(13).Value = 1
  Option1(17).Value = 1
  Text4(11).Text = 15
  Text4(10).Text = 104
  Text2.Text = 345
End If
End Sub Private Sub Check2_Click()
'Enter the components of the EPRI horizontal tower
If Check2.Value = 1 Then
  Check1.Value = 0
  Text4(0).Text = 23
  Text4(1).Text = 41
  Text4(2).Text = 100
  Text4(5).Text = 53
  Text4(4).Text = 41
  Text4(3).Text = 100
```

```
Text4(6).Text = 38
Text4(7).Text = 71
Text4(8).Text = 100
Option1(1).Value = 1
Option1(4).Value = 1
Option1(8).Value = 1
Option1(9).Value = 1
Option1(13).Value = 1
Option1(17).Value = 1
Text4(11).Text = 23
Text4(10).Text = 102
Text2.Text = 345
End If
End Sub Private Sub Check3_Click()
If Check3.Value = 1 Then
Frame5.Enabled = True
Frame6(0).Enabled = True
Frame6(1).Enabled = True
Frame6(2).Enabled = True
Option1(9).Enabled = True
Option1(10).Enabled = True
Option1(11).Enabled = True
Option1(12).Enabled = True
Option1(13).Enabled = True
Option1(14).Enabled = True
Option1(15).Enabled = True
Option1(16).Enabled = True
Option1(17).Enabled = True
Text3.Enabled = True
Label3.Enabled = True
Text4(15).Enabled = True
Text4(16).Enabled = True
Text4(17).Enabled = True
Label2(0).Enabled = True
Label2(1).Enabled = True
Label2(2).Enabled = True
Text4(15).Text = Text4(2).Text
Text4(16).Text = Text4(3).Text
Text4(17).Text = Text4(8).Text
Else
Frame5.Enabled = False
Frame6(0).Enabled = False
Frame6(1).Enabled = False
Frame6(2).Enabled = False
Option1(9).Enabled = False
Option1(10).Enabled = False
Option1(11).Enabled = False
Option1(12).Enabled = False
Option1(13).Enabled = False
Option1(14).Enabled = False
Option1(15).Enabled = False
Option1(16).Enabled = False
Option1(17).Enabled = False
Text4(15).Enabled = False
```

```
        Text4(16).Enabled = False
        Text4(17).Enabled = False
        Label2(0).Enabled = False
        Label2(1).Enabled = False
        Label2(2).Enabled = False
    End If
End Sub Private Sub Form_Load()
    Text3.Text = 0
    Frame5.Enabled = False
    Frame6(0).Enabled = False
    Frame6(1).Enabled = False
    Frame6(2).Enabled = False
    Option1(9).Enabled = False
    Option1(10).Enabled = False
    Option1(11).Enabled = False
    Option1(12).Enabled = False
    Option1(13).Enabled = False
    Option1(14).Enabled = False
    Option1(15).Enabled = False
    Option1(16).Enabled = False
    Option1(17).Enabled = False
    Text3.Enabled = False
    Label3.Enabled = False
    Text4(15).Enabled = False
    Text4(16).Enabled = False
    Text4(17).Enabled = False
    Text4(15).Text = " "
    Text4(16).Text = " "
    Text4(17).Text = " "
    Label2(0).Enabled = False
    Label2(1).Enabled = False
    Label2(2).Enabled = False
    Text4(0).Text = 13.5
    Text4(1).Text = 35
    Text4(2).Text = 100
    Text4(5).Text = 16
    Text4(4).Text = 50.5
    Text4(3).Text = 100
    Text4(6).Text = 13.5
    Text4(7).Text = 66
    Text4(8).Text = 100
    Option1(1).Value = 1
    Option1(4).Value = 1
    Option1(8).Value = 1
    Option1(9).Value = 1
    Option1(13).Value = 1
    Option1(17).Value = 1
    Text4(11).Text = 11
    Text4(10).Text = 84
    Text2.Text = 138
    Text4(12).Text = -100
    Text4(13).Text = 100
    Text4(14).Text = 1
    Text4(9).Text = 3
```

```
Text1.Visible = False

End Sub

'*****************INPUT DATA *********************************************

Private Sub InputData()
Dim PCmplx1 As Complex, PCmplx2 As Complex
Dim I As Integer
Dim Lag As Double
Dim LagC As Complex Num = 0
For I = 1 To 8
 Phase(I) = MakeCmplx(0, 0)
 PhaseI(I) = MakeCmplx(0, 0)
 Position(I, 1) = 0
 Position(I, 2) = 0
Next I 'Input all the position and phase information from the user
If Option1(1).Value Or Option1(2).Value Or Option1(3).Value Then
 If Option1(1).Value Then
  Phase(1) = MakeCmplx(1, 0)
 ElseIf Option1(2).Value Then
  Phase(1) = MakeCmplx(-0.5, -0.8666)
 Else
  Phase(1) = MakeCmplx(-0.5, 0.86666)
 End If
End If
If Option1(5).Value Or Option1(4).Value Or Option1(0).Value Then
 If Option1(5).Value Then
  Phase(2) = MakeCmplx(1, 0)
 ElseIf Option1(4).Value Then
  Phase(2) = MakeCmplx(-0.5, -0.8666)
 Else
  Phase(2) = MakeCmplx(-0.5, 0.86666)
 End If
End If
If Option1(6).Value Or Option1(7).Value Or Option1(8).Value Then
 If Option1(6).Value Then
  Phase(3) = MakeCmplx(1, 0)
 ElseIf Option1(7).Value Then
  Phase(3) = MakeCmplx(-0.5, -0.8666)
 Else
  Phase(3) = MakeCmplx(-0.5, 0.86666)
 End If
End If
 Position(1, 1) = Text4(0).Text / 3.2808    'from feet to meters
 Position(1, 2) = Text4(1).Text / 3.2808    'from feet to meters
 Position(2, 1) = Text4(5).Text / 3.2808    'from feet to meters
 Position(2, 2) = Text4(4).Text / 3.2808    'from feet to meters
 Position(3, 1) = Text4(6).Text / 3.2808    'from feet to meters
 Position(3, 2) = Text4(7).Text / 3.2808    'from feet to meters
 PhaseI(1) = ScalarMult(Text4(2).Text, Phase(1))
```

```
PhaseI(2) = ScalarMult(Text4(3).Text, Phase(2))
PhaseI(3) = ScalarMult(Text4(8).Text, Phase(3))

If Check3.Value = 1 Then     'If there is a second circuit, do the following
  If Option1(9).Value Or Option1(10).Value Or Option1(11).Value Then
    If Option1(9).Value Then
      Phase(4) = MakeCmplx(1, 0)
    ElseIf Option1(10).Value Then
      Phase(4) = MakeCmplx(-0.5, -0.8666)
    Else
      Phase(4) = MakeCmplx(-0.5, 0.86666)
    End If
  End If
  If Option1(14).Value Or Option1(13).Value Or Option1(12).Value Then
    If Option1(14).Value Then
      Phase(5) = MakeCmplx(1, 0)
    ElseIf Option1(13).Value Then
      Phase(5) = MakeCmplx(-0.5, -0.8666)
    Else
      Phase(5) = MakeCmplx(-0.5, 0.86666)
    End If
  End If
  If Option1(15).Value Or Option1(16).Value Or Option1(17).Value Then
    If Option1(15).Value Then
      Phase(6) = MakeCmplx(1, 0)
    ElseIf Option1(16).Value Then
      Phase(6) = MakeCmplx(-0.5, -0.8666)
    Else
      Phase(6) = MakeCmplx(-0.5, 0.86666)
    End If
  End If
  Position(4, 1) = -Position(1, 1)
  Position(4, 2) = Position(1, 2)
  Position(5, 1) = -Position(2, 1)
  Position(5, 2) = Position(2, 2)
  Position(6, 1) = -Position(3, 1)
  Position(6, 2) = Position(3, 2)
  Position(7, 1) = Text4(11).Text / 3.2808
  Position(7, 2) = Text4(10).Text / 3.2808
  Position(8, 1) = -Position(7, 1)
  Position(8, 2) = Position(7, 2)
  PhaseI(4) = ScalarMult(Text4(15).Text, Phase(4))
  PhaseI(5) = ScalarMult(Text4(16).Text, Phase(5))
  PhaseI(6) = ScalarMult(Text4(17).Text, Phase(6))
  Lag = Text3.Text
  Lag = Lag * 3.14159265359 / 180
  LagC = MakeCmplx(Cos(Lag), Sin(Lag))

PhaseI(4) = MultCmplx(PhaseI(4), LagC)
  PhaseI(5) = MultCmplx(PhaseI(5), LagC)
  PhaseI(6) = MultCmplx(PhaseI(6), LagC)
  Phase(7) = MakeCmplx(0, 0)
  Phase(8) = MakeCmplx(0, 0)

Num = 8
Else           'There is no second circuit - include the ground wires
```

```
Position(4, 1) = Text4(11).Text / 3.2808
Position(4, 2) = Text4(10).Text / 3.2808
Position(5, 1) = -Position(4, 1)
Position(5, 2) = Position(4, 2)
Phase(4) = MakeCmplx(0, 0)
Phase(5) = MakeCmplx(0, 0)
Num = 5
End If
For I = 1 To Num
 If PhaseI(I).Real = 0 And PhaseI(I).Imaginary = 0 Then
  Phase(I).Real = 0
  Phase(I).Imaginary = 0
 Else
  Phase(I) = ScalarMult(Text2.Text / Sqr(3), Phase(I))
 End If
Next I Py = Text4(9).Text / 3.2808
End Sub '****************SUPPORTING ROUTINES
'************************************************

'***************INVERTING ROUTINE********************
Private Sub Invert(Num As Integer, Mat() As Double)
Dim Py As Double
Dim K, I, J As Integer
For K = 1 To Num
    Py = -1# / Mat(K, K)
    For I = 1 To Num
     For J = 1 To Num
     If ((I = K) Or (J = K)) Then GoTo 50
     Mat(I, J) = Mat(I, J) - Mat(K, J) * Mat(I, K) / Mat(K, K)
50:  Next J
   Next I
   For I = 1 To Num
    For J = 1 To Num
    If ((I = K) And (J = K)) Then GoTo 51
    If ((I = K) Or (J = K)) Then Mat(I, J) = Mat(I, J) * Py
51: Next J
   Next I
   Mat(K, K) = Py
Next K
  For I = 1 To Num
  For J = 1 To Num
   Mat(I, J) = -Mat(I, J)
  Next J
  Next I
End Sub
```

```
'*******************DISTANCE COMPUTER******************
Private Function Dist(x1 As Double, y1 As Double, x2 As Double, y2 As Double) As Double
Dist = (x1 - x2) ^ 2 + (y1 - y2) ^ 2
Dist = Sqr(Dist)
End Function '*****************COMPLEX FUNCTIONS****************
Private Function AddCmplx(Cmplx1 As Complex, Cmplx2 As Complex) As Complex
 AddCmplx.Real = Cmplx1.Real + Cmplx2.Real
 AddCmplx.Imaginary = Cmplx1.Imaginary + Cmplx2.Imaginary
End Function
Private Function ScalarMult(C1 As Double, Cmplx As Complex) As Complex
 ScalarMult.Real = Cmplx.Real * C1
 ScalarMult.Imaginary = Cmplx.Imaginary * C1
End Function
Private Function Mag(Cmplx As Complex) As Double
 Mag = Sqr(Cmplx.Real ^ 2 + Cmplx.Imaginary ^ 2)
End Function
Private Function Angle(Cmplx As Complex) As Double
 If Cmplx.Real = 0 Then
  If Cmplx.Imaginary < 0 Then
   Angle = -3.14159265359 / 2
  End If
  If Cmplx.Imaginary > 0 Then
   Angle = 3.14159265359 / 2
  End If
  If Cmplx.Imaginary = 0 Then
   Angle = 0
  End If
 End If
 If Cmplx.Real <> 0 Then
  Angle = Atn(Cmplx.Imaginary / Cmplx.Real)
 End If
 If (Cmplx.Real < 0) And (Cmplx.Imaginary < 0) Then
  Angle = Angle + 3.14159265359
 End If
 If (Cmplx.Real < 0) And (Cmplx.Imaginary > 0) Then
  Angle = Angle - 3.14159265359
 End If
End Function
Private Function MultCmplx(Cmplx1 As Complex, Cmplx2 As Complex) As Complex
Dim Dummy As Complex
 Dummy.Real = Cmplx1.Real * Cmplx2.Real - Cmplx1.Imaginary * Cmplx2.Imaginary
 Dummy.Imaginary = Cmplx1.Imaginary * Cmplx2.Real + Cmplx1.Real * Cmplx2.Imaginary
 MultCmplx = Dummy
End Function
Private Function MakeCmplx(D1 As Double, D2 As Double) As Complex
 MakeCmplx.Real = D1
 MakeCmplx.Imaginary = D2
End Function
Private Function DivCmplx(Cmplx1 As Complex, Cmplx2 As Complex) As Complex
Dim Dummy As Complex
 Dummy.Real = Cmplx1.Real * Cmplx2.Real + Cmplx1.Imaginary * Cmplx2.Imaginary
 Dummy.Imaginary = Cmplx1.Imaginary * Cmplx2.Real - Cmplx1.Real * Cmplx2.Imaginary
 Dummy.Real = Dummy.Real / (Cmplx2.Real ^ 2 + Cmplx2.Imaginary ^ 2)
 Dummy.Imaginary = Dummy.Imaginary / (Cmplx2.Real ^ 2 + Cmplx2.Imaginary ^ 2)
```

DivCmplx = Dummy
End Function

What is claimed is:

1. A method for measuring electrical power dynamics of a facility, comprising:

placing at least one apparatus comprising a magnetic transducer and an electric transducer in proximity to and not connected to at least one electrical line connected to the facility;

receiving electric and magnetic fields of said at least one electrical line with said at least one apparatus;

processing said electric and magnetic fields to obtain information representative of magnitude and relative phase of said electric and magnetic fields;

transmitting said information to a central computing site;

determining said electrical power dynamics of said facility from said information at said central computing site; and relaying data regarding said electrical power dynamics to an end-user.

2. The method of claim 1, wherein said data comprises real-time information regarding said electrical power dynamics.

3. The method of claim 1, further comprising relaying said data to a plurality of end-users.

4. The method of claim 1, wherein said determining step further comprises obtaining said information from a plurality of said apparatuses, each of said plurality of apparatuses in proximity to and not connected to different electrical lines, said determining comprising a summation of said information from each of said plurality of apparatuses.

5. The method of claim 1, wherein said relaying step occurs via the Internet.

6. The method of claim 1, wherein said relaying step occurs via secure transmission.

7. The method of claim 1, wherein said data comprises graphical information regarding power flow respecting said facility.

8. The method of claim 1, wherein said at least one electrical line comprises a plurality of lines, and wherein said electrical power dynamics comprise net current power flow in said plurality of lines.

9. A method for remotely delivering real-time information regarding operational status of a power system, said method comprising:

converting magnetic field of current at a location remote to a plurality of electrical lines of said power system into magnetically transduced signals;

conditioning said magnetically transduced signals into conditioned magnetically transduced signals;

conditioning a reference signal for each of said conditioned magnetically transduced signals into conditioned reference signals;

measuring magnitude of each of said conditioned magnetically transduced signals;

measuring a phase angle between respective said conditioned magnetically transduced signals and said conditioned reference signals;

transmitting said magnitudes and said phase angles to a central facility;

determining said real-time information from said magnitudes and said phase angles, at said central facility;

relaying said real-time information to an end user.

10. The method of claim 9, further comprising using state estimation to predict power flow in at least a portion of said power system not monitored.

11. A method for providing information relating to current in an electrical line to a remote end user, comprising:

placing an apparatus comprising a magnetic transducer in proximity of and not connected to said electrical line;

receiving magnetic field emanating from said electrical line with said magnetic transducer;

receiving an electrical signal synchronized to power system frequency with said apparatus;

processing said magnetic field and said electrical signal to determine said information relating to said current in the line; and transmitting said information to said remote end user.

12. The method of claim 11, wherein said information comprises net current power flow in said electrical line.

13. The method of claim 11, further comprising transmitting said information to a plurality of said remote end users, said remote end users comprising power market participants.

14. The method of claim 11, wherein said information comprises graphical information regarding power and current flow in said electrical line.

15. The method of claim 11, wherein said information comprises historical information regarding operational status of said electrical line.

* * * * *